US012712012B2

(12) United States Patent
Martinelli et al.

(10) Patent No.: US 12,712,012 B2
(45) Date of Patent: Aug. 18, 2026

(54) STREAMING MODE FOR ACCESSING MEMORY CELLS IN A MEMORY DEVICE

(71) Applicant: Micron Technology, Inc., Boise, ID (US)

(72) Inventors: Andrea Martinelli, Bergamo (IT); Christophe Vincent Antoine Laurent, Agrate Brianza (IT); Ferdinando Bedeschi, Biassono (IT); Efrem Bolandrina, Fiorano al Serio (IT)

(73) Assignee: Micron Technology, Inc., Boise, ID (US)

( * ) Notice: Subject to any disclaimer, the term of this patent is extended or adjusted under 35 U.S.C. 154(b) by 517 days.

(21) Appl. No.: 17/898,346

(22) Filed: Aug. 29, 2022

(65) Prior Publication Data

US 2024/0071476 A1 Feb. 29, 2024

(51) Int. Cl.

| | |
|---|---|
| ***G11C 11/4096*** | (2006.01) |
| ***G11C 11/408*** | (2006.01) |
| ***G11C 11/4091*** | (2006.01) |

(52) U.S. Cl.
CPC ...... *G11C 11/4096* (2013.01); *G11C 11/4085* (2013.01); *G11C 11/4091* (2013.01)

(58) Field of Classification Search
CPC ............ G11C 11/4096; G11C 11/4085; G11C 11/4091
See application file for complete search history.

(56) References Cited

U.S. PATENT DOCUMENTS

2009/0122592 A1* 5/2009 Tokiwa .................. G11C 13/00 365/175

* cited by examiner

*Primary Examiner* — Alfredo Bermudez Lozada
(74) *Attorney, Agent, or Firm* — Greenberg Traurig

(57) ABSTRACT

Systems, methods, and apparatus for a memory device. In one approach, a memory device selectively enters a streaming mode when accessing memory cells in a memory array. A controller determines for new read operations whether memory cells will be accessed in a streaming mode or in a random mode. First memory cells addressed using a wordline are read by the controller. The wordline is charged to an initial voltage for reading the first memory cells. When in the streaming mode, instead of discharging the wordline after reading the first memory cells, as is done for a random mode, the controller keeps a minimum bias on the wordline and returns the wordline again to the initial voltage for performing a next read operation to read second memory cells. This saves memory device power.

30 Claims, 20 Drawing Sheets

130
Bitline Drivers 137
Array of Memory Cells 133
Memory Cell 103
Controller 131
Read Manager 113
Wordline Drivers 135

141
Bitline Driver 147
143
Memory Cell 103
Controller 131
Read Manager 113
Wordline Driver 145

STREAMING MODE FOR ACCESSING MEMORY CELLS IN A MEMORY DEVICE

FIELD OF THE TECHNOLOGY

At least some embodiments disclosed herein relate to memory devices in general, and more particularly, but not limited to memory devices that include a streaming mode for accessing memory cells in a memory array.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0". In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
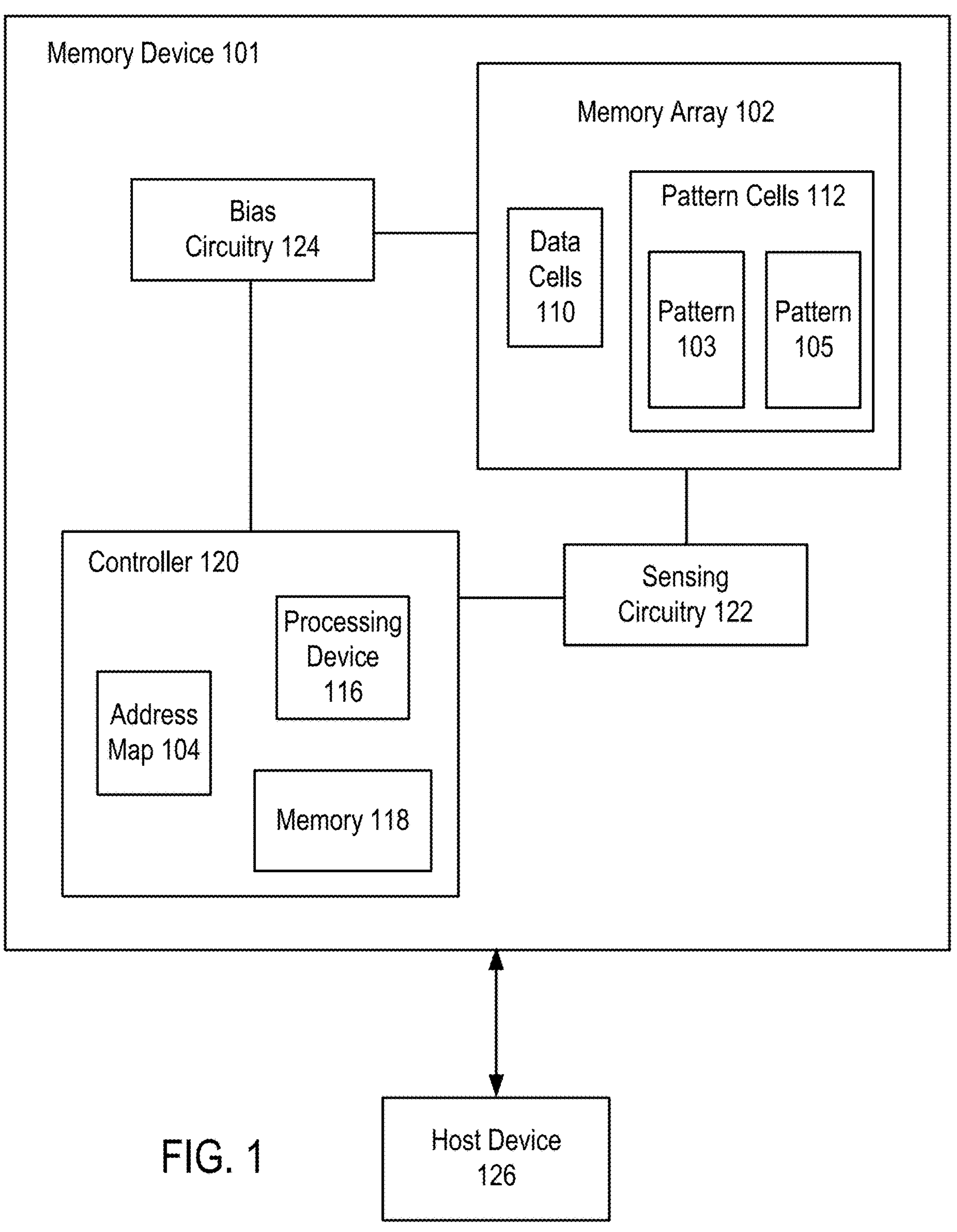
FIG. 1 shows a memory device that determines whether to use a streaming mode for accessing a memory array when performing read or write operations, in accordance with some embodiments.

The following disclosure describes various embodiments for memory devices including a controller that determines whether to use a streaming mode of operation when accessing memory cells (e.g., memory cells of a three-dimensional cross-point memory array). For example, a controller may decide to use a streaming mode for accessing memory cells that are sequentially addressed and/or based on other reasons (e.g., internal memory management). The use of the streaming mode can save power and/or increase bandwidth of the memory device.

At least some embodiments herein relate to memory devices that use bipolar operations for a memory array. In one example, bipolar select voltages are used to select memory cells of the memory array. In one example, the memory cells are arranged in a cross-point architecture. In one example, each memory cell is formed using a single select device. In one example, the select device includes a chalcogenide material that switches (e.g., snaps) when a sufficient voltage is applied across the memory cell.

The memory device may, for example, store data used by a host device (e.g., a computing device of an autonomous vehicle, or another computing device that accesses data stored in the memory device). In one example, the memory device is a solid-state drive mounted in an electric vehicle.

In some cases, a memory device may include an array of memory cells arranged in a three-dimensional (3D) architecture, such as a cross-point architecture, to store the set of data. The memory cells in a cross-point architecture may, for example, represent a first logic state (e.g., a logic 1, a SET state) associated with a first set of threshold voltages, or a second logic state (e.g., a logic 0, a RESET state) associated with a second set of threshold voltages.

In other embodiments, the memory cells may be arranged in a three-dimensional (3D) vertical architecture. A 3D vertical architecture may include memory cells located at the crossing between a vertical access line (e.g., a bitline pillar), and each one of a plurality of second access lines (e.g., wordlines), formed in horizontal planes or decks parallel to each other.

More generally, an integrated circuit memory cell, such as a memory cell in a cross-point memory or a 3D vertical array, can be programmed to store data by the way of its state at a voltage applied across the memory cell. For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed, for example, to have a threshold voltage in one of more than two separate voltage regions.

The threshold voltage of a memory cell is such that when the voltage applied across the memory cell is increased to above the threshold voltage, the memory cell switches by changing rapidly or abruptly, snapping (e.g., for a chalcogenide memory cell), or jumping from a non-conductive state to a conductive state. The non-conductive state allows a small leak current to go through the memory cell; and in contrast, the conductive state allows more than a threshold amount of current to go through. Thus, a memory device can use a sensor (e.g., sense amplifier) to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode.

When memory cells are accessed in a memory array, various circuit paths are used. For example, bitlines and wordlines are activated to select one or more memory cells by applying voltages to them using bias circuitry of a memory device. In some cases, certain of the nodes on the circuit paths used to access the memory cells are highly-capacitive relative to other nodes.

For example, in a vertically integrated cross-point memory array, the wordline used to access one or more memory cells has a significantly greater parasitic capacitance than the bitline (or digit line) used to access the same memory cell(s). The charging and discharging of such highly-capacitive nodes is power intensive, and also causes delay in accessing the memory cells due to the lengthy charging time required to fully activate, for example, the wordline. Other highly-capacitive nodes that can be similarly problematic in a cross-point memory array include gate lines and sensing nodes/amplifiers.

In one example, a read operation for a cross-point memory array includes a selection phase and an unselection (deselection) phase. When a controller receives a read command from a host, the read operation begins by selecting a target wordline and gate line used to access memory cells. This involves charging the wordline and gate line to increase their voltages (charging from an idle state in an idle mode). After the data is read from the memory cells, the wordline and gate line are unselected (discharged to return to the idle state). These wordline and gate line selection and unselection phases consume significant time and power that degrades memory performance. For example, data bandwidth is decreased and/or power consumption is increased.

To address the above and other technical problems, a memory device selectively enters a streaming mode when accessing certain memory cells in a memory array. For example, a controller determines for one or more read operations whether memory cells will be accessed in a streaming mode or in a default mode. In one example, the default mode corresponds to a random mode. In one example, the controller uses the streaming mode in response to signaling from a host device that is storing data in a memory device for which access is controlled by the controller. In one example, the signaling from the host requires use of sequential addressing.

In one embodiment, first memory cells addressed using a wordline are read by a controller. The wordline is charged to an initial voltage for reading the first memory cells. When in the streaming mode, instead of discharging the wordline after reading the first memory cells, as is done for a default or random mode, the controller returns the wordline to the initial voltage. Thus, the wordline is kept biased to the voltage needed for performing a next read operation to read second memory cells (e.g., that are addressed using a common wordline).

For example, after a voltage ramp applied to the wordline ends and the first memory cells are read, the wordline is biased to the initial voltage corresponding to the starting point for the ramp. This prepares the wordline for reading the next group of second memory cells. This avoids the wasteful discharging of the wordline back to a voltage (e.g., ground) corresponding to an idle mode. Returning the wordline to the initial voltage in preparation for a read operation instead of an idle mode voltage saves energy and time.

In one embodiment, a memory device has a memory array including memory cells (e.g., chalcogenide memory cells in a vertically integrated cross-point memory array). The memory device includes bias circuitry to apply voltages to the memory cells when performing read, write, and/or other operations. In one example, the bias circuitry includes decoders to direct the applied voltages to wordlines, gate lines, and/or digit lines. When performing a read operation, sensing circuitry of the memory device is used to read a logic state of the memory cells. In some cases, the sensing circuitry is used during write operations (e.g., for adjusting a write voltage(s)).

It should be noted that the terms “digit lines” and “bit lines” are used for describing various embodiments herein. The terms “digit lines” and “bit lines” are generally used interchangeably herein.

The memory device has a controller that manages access to the memory array. The controller determines whether to use a regular, default mode for access (e.g., random mode access) or a streaming mode for access. The decision to use the streaming mode can be made for a single address or multiple addresses (e.g., a range of sequential addresses provided by a host device).

In one example, the controller receives a command (e.g., from a host device) to read data at first and second addresses (e.g., addresses provided from the host with the command). The first address corresponds to first memory cells of the memory array, the second address corresponds to second memory cells of the memory array, and the first and second memory cells are accessed using a common wordline. In one example, the first and second memory cells are in a same tile of the memory array.

In response to receiving the command, the controller biases, using the bias circuitry, a voltage of the wordline to an initial voltage (e.g., a voltage used for a start of a read voltage ramp for a read algorithm of the controller). The controller causes the sensing circuitry to read the first memory cells. This read operation includes increasing a magnitude of the voltage of the wordline from the initial voltage during the ramp.

In one example, an idle mode voltage of the wordline is ground or 0 volts. During a selection phase, the wordline voltage is decreased to an initial voltage of negative 2 volts (−2 V). The read voltage is then ramped in incremental voltage changes of negative 0.2 volts (−0.2 V), for example, until a final maximum read voltage is reached. In one example, this maximum read voltage corresponds to a time at which the controller determines that a condition is satisfied (e.g., a minimum read error rate is achieved, a number or proportion of data memory cells have switched, and/or a number of reference or pattern cells have switched).

When the controller is operating in a streaming mode, after reading the first memory cells, the controller biases the wordline to return the voltage of the wordline to the initial voltage (e.g., in preparation for a next read access of the memory array using the common wordline). When in streaming mode, the voltage of the wordline is not returned to its idle mode voltage because the wordline will be used again to read the next set of memory cells (e.g., the second memory cells).

After returning the voltage of the wordline to the initial voltage, the controller causes the sensing circuitry to read the second memory cells. This includes increasing a magnitude of the voltage of the wordline from the initial voltage. In one example, this involves using a ramp voltage such as described for the first memory cells above. After reading the first and second memory cells, the read data is, for example, sent to the host device.

It should be noted that in other embodiments, a read voltage ramp is not required. Instead, the read voltage can be maintained constant, for example, at the initial voltage (e.g., −3.5 V) for reading all of the first memory cells, and then reading the second memory cells in a similar way.

Various advantages are provided by at least some embodiments described herein when the streaming mode is used by a controller. In one example, the power and time needed by the wordline and gate line selection and unselection phases is significantly reduced. In one example, some sensing nodes are not discharged during a read (e.g., because memory cells do not snap). These sensing nodes do not need to be fully recharged and can be reused for the next read operation. In one example, read algorithms of the controller that use a streaming mode improve speed performance of the memory device.

FIG. 1 shows a memory device that determines whether to use a streaming mode for accessing a memory array when performing read or write operations, in accordance with some embodiments. Memory device 101 includes a memory array 102 having data cells 110 (and optionally having pattern cells 112). The data cells 110 generally store data (e.g., user data stored for host device 126). Access to memory array 102 is managed by controller 120.

In one embodiment, controller 120 receives, from host device 126, a read command. In response to receiving the read command, controller 120 reads data in parallel from a plurality of partitions of memory array 102. The data is read from each of the partitions using a streaming mode. Controller 120 enters the streaming mode in response to determining that the first and second memory cells are addressed or accessed using the common wordline. In one embodiment, controller 120 makes this determination by comparing one or more addresses associated with the read command to an address map 104.

In one example, address map 104 is stored in memory 118 and relates addresses in memory array 102 to physical nodes/features of memory array 102 such as wordlines, gate lines, sensing nodes, etc. In one example, address map 104 stores data indicating those data cells 110 that are accessed using a common node (e.g., a common wordline). Controller 120 uses this data in determining whether to access data cells 110 using a streaming mode or a default mode (e.g., random mode).

Figure 19:
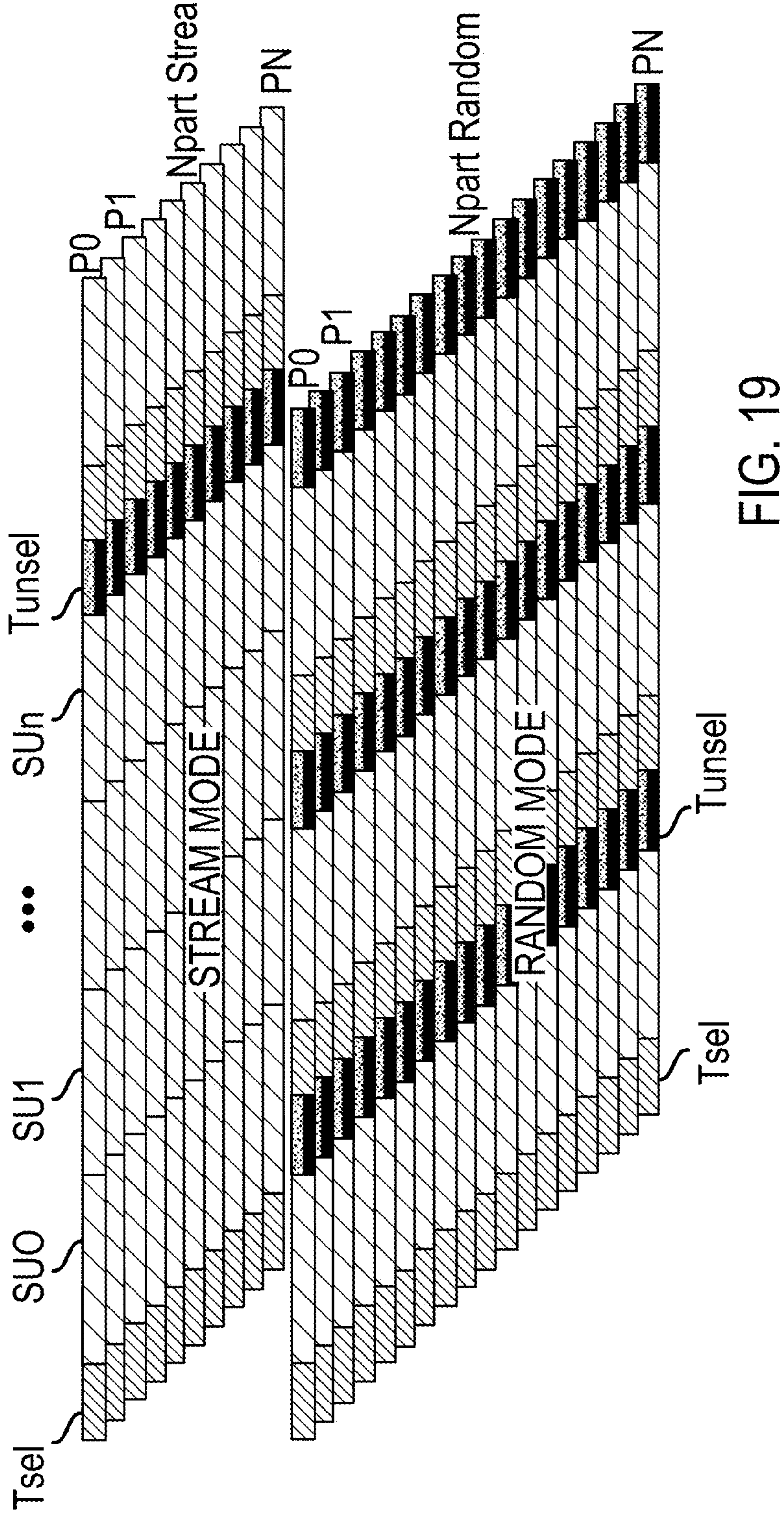
FIG. 19 shows parallel access to data using multiple partitions operating in a streaming mode or a random mode, in accordance with some embodiments.

For each partition, the streaming mode includes reading data from first and second memory cells (e.g., from successive stream units SU0, SU1 of a partition P0 as in FIG. 19) of the respective partition using a common wordline (not shown) of memory array 102. Controller 120 sends the read data to host device 126.

In one embodiment, memory device 101 uses reference patterns to select a read voltage for performing read operations (e.g., when operating in a default/random and/or streaming mode). The pattern cells 112 generally store various reference patterns (e.g., a known pattern of all ones (1s)). For example, two reference patterns are associated with each codeword or block stored in data cells 110.

In one example, during a read operation to read a codeword, controller 120 reads the reference patterns associated with the codeword. For example, controller 120 counts a number of pattern cells 112 that snap when being read. Based on the number that snap, controller 120 selects a read voltage for reading the codeword. In one example, the read voltage is a current voltage applied to the pattern cells 112 when a threshold number of cells snap.

In one embodiment, the pattern cells 112 are organized into various patterns including patterns 103, 105. Each of patterns 103, 105 includes memory cells of the same type. Also, the memory cells in the patterns 103, 105 are of the same type as the memory cells that store data (e.g., data cells 110).

Each pattern 103, 105 is associated with a codeword stored in data cells 110. Each pattern 103, 105 has pattern cells in a different logic state. For example, each of the pattern cells 112 in pattern 103 is written or programmed to store only a first logic state that corresponds to a low voltage threshold magnitude. In one example, the first logic state is a logic one (1) or SET state for a positive polarity. Each of the pattern cells 112 in pattern 105 is written or programmed to store only a second logic state that corresponds to a high voltage threshold magnitude. In one example, the second logic state is a logic zero (0) or RESET state for a positive polarity. Data cells 110 store data (e.g., user data for host device 126) in either the first logic state or the second logic state.

In one embodiment, pattern cells 112 are configured so that the operating history for pattern cells 112 is the same as or similar to data cells 110. In one example, each pattern 103, 105 is configured to correspond to a respective set of data cells 110. In one example, pattern cells 112 are in a same location of memory array 102 as data cells 110. In one example, the same location is the same tile or partition of memory array 102. In one example, the same location is a location on a same access line as data cells 110. In one example, the same location is on the same wordline as used to select data cells 110.

In one embodiment, when performing a read operation, bias circuitry 124 applies voltages to pattern cells 112. In one example, bias circuitry 124 includes wordline and bitline drivers (not shown) to bias wordlines and bitlines of memory array 102.

Controller 120 determines which pattern cells 112 switch. In one example, controller 120 determines that a number of memory cells in the pattern that switch (e.g., threshold or snap) is greater than a threshold. In one example, the threshold is 50-95% or more of the memory cells in a pattern switching. Counters can be used to count the number of memory cells that switch in a pattern 103, 105 and/or a number of data cells 110 that switch when being read.

Sensing circuitry 122 is used to read pattern cells 112 and data cells 110. In one example, sensing circuitry 122 includes sense amplifiers for sensing a characteristic associated with memory cells of the memory array 102. The characteristic can be, for example, a voltage and/or current associated with a selected memory cell.

Controller 120 causes bias circuitry 124 to apply voltages to each of the pattern cells 112 of patterns 103, 105. The voltages can be applied in parallel so that each pattern 103, 105 can be sensed by sensing circuitry 122 simultaneously. In one example, the voltages are increasing magnitudes of voltage values applied to each pattern 103, 105 (e.g., +2, +2.5, +3, +3.5, +4, +4.5, +5 V) separated by steps (e.g., 0.5 V steps). In one example, the voltages are separated by equal steps. In one example, the voltages are separated by steps that vary in size. The variation in the size of the steps can be determined by controller 120 based on an operating context of memory device 101, such as an error rate or other characteristic associated with prior reading of data cells of memory array 102.

After the voltages are applied to pattern cells 112, controller 120 determines which of the cells switch for each pattern. Controller 120 uses data or signals from sensing circuitry 122 that indicate which pattern cells 112 have switched.

Based on determining a number of pattern cells 112 that switch, controller 120 determines an initial read voltage to use when reading (e.g., user data) from data cells 110 that are associated with the pattern cells 112. In one example, bias circuitry 124 applies this initial read voltage to data cells 110 when starting a read. In one example, bias circuitry 124 jumps to this initial read voltage during a read of data cells 110.

In one embodiment, when reading the data cells in a streaming mode, the initial read voltage determined above using the pattern cells, and/or based on an extent of switching by the data cells is used as a basis to select an initial voltage to apply at the start of a ramp that biases a wordline to access the data cells.

Controller 120 includes one or more processing devices 116 and memory 118. In one example, memory 118 stores firmware executed by processing device 116 to select and apply the read voltages.

Memory controller 120 can use bias circuitry 124 to generate voltages for applying read and other voltages (e.g., initial read and read retry). Bias circuitry 124 can also generate voltages for applying write voltages to data cells 110, and/or pattern cells 112 as part of programming operations. Bias circuitry 124 may be used to generate read voltages for read operations performed on memory array 102 (e.g., in response to a read command from host device 126).

Sensing circuitry 122 can be used to sense a state of each memory cell in memory array 102. In one example, sensing circuitry 122 includes sense amplifiers used to detect a current caused by applying various voltages to memory cells in memory array 102. In one example, bias circuitry 124 applies a read voltage to data cells 110 or pattern cells 112. Sensing circuitry 122 senses a current associated with each of the data cells 110 or pattern cells 112 caused by applying the read voltage.

In one example, if sensing circuitry 122 determines that the current for a memory cell is greater than a fixed threshold (e.g., a predetermined level of current), then memory controller 120 determines that the memory cell has switched (e.g., snapped).

In one embodiment, memory controller 120 receives a write command from a host device 126. The write command is accompanied by data (e.g., user data of a user of host device 126) to be written to memory array 102. In response to receiving the write command, controller 120 initiates a programming operation. Controller 120 determines whether to use a streaming mode for performing the write command. In one example, the streaming mode is activated in response to determining that data is to be written to sequential addresses in memory array 102. In one example, the streaming mode is activated based on comparing addresses for data to be written to address data in address map 104.

In one embodiment, controller 120 uses counters to count the number of data or pattern cells that snap as a read voltage is applied. Data stored in the counters can be used as part of an evaluation when determining a read voltage to apply. This stored data can optionally be used in combination with error results from ECC of read data when selecting the read voltage (e.g., a read retry voltage). For example, the stored data and/or ECC results can be provided as inputs to a machine learning model (e.g., artificial neural network) to provide an output of a voltage to use for read retry.

In one example, controller 120 may use write voltages (e.g., write pulses) to write a logic state to a memory cell, such as data cell 110 or pattern cell 112 during a write or programming operation. The write pulses may be applied by providing a first voltage to a bitline and providing a second voltage to a wordline to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond.

In one example, the polarity of the read or write pulses may be either a first polarity or a second polarity. For example, a write pulse may apply a voltage to a memory cell in a first polarity (e.g., bitline at 6 V and wordline at 0 V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell for a period of time (e.g., 10-50 ns, 1-100 ns, 1 ns to 1 microsecond).

In some embodiments, the read pulse may be a square pulse. In some embodiments, the read pulse may be a ramp, that is, a linearly increasing voltage may be applied across the memory cell.

In one example, after being accessed (e.g., selected), a memory cell may be read, or sensed, by a sense component (e.g., sensing circuitry 122) to determine the stored state of the memory cell. For example, a voltage may be applied to the memory cell (using a wordline and bitline) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

Figure 2:
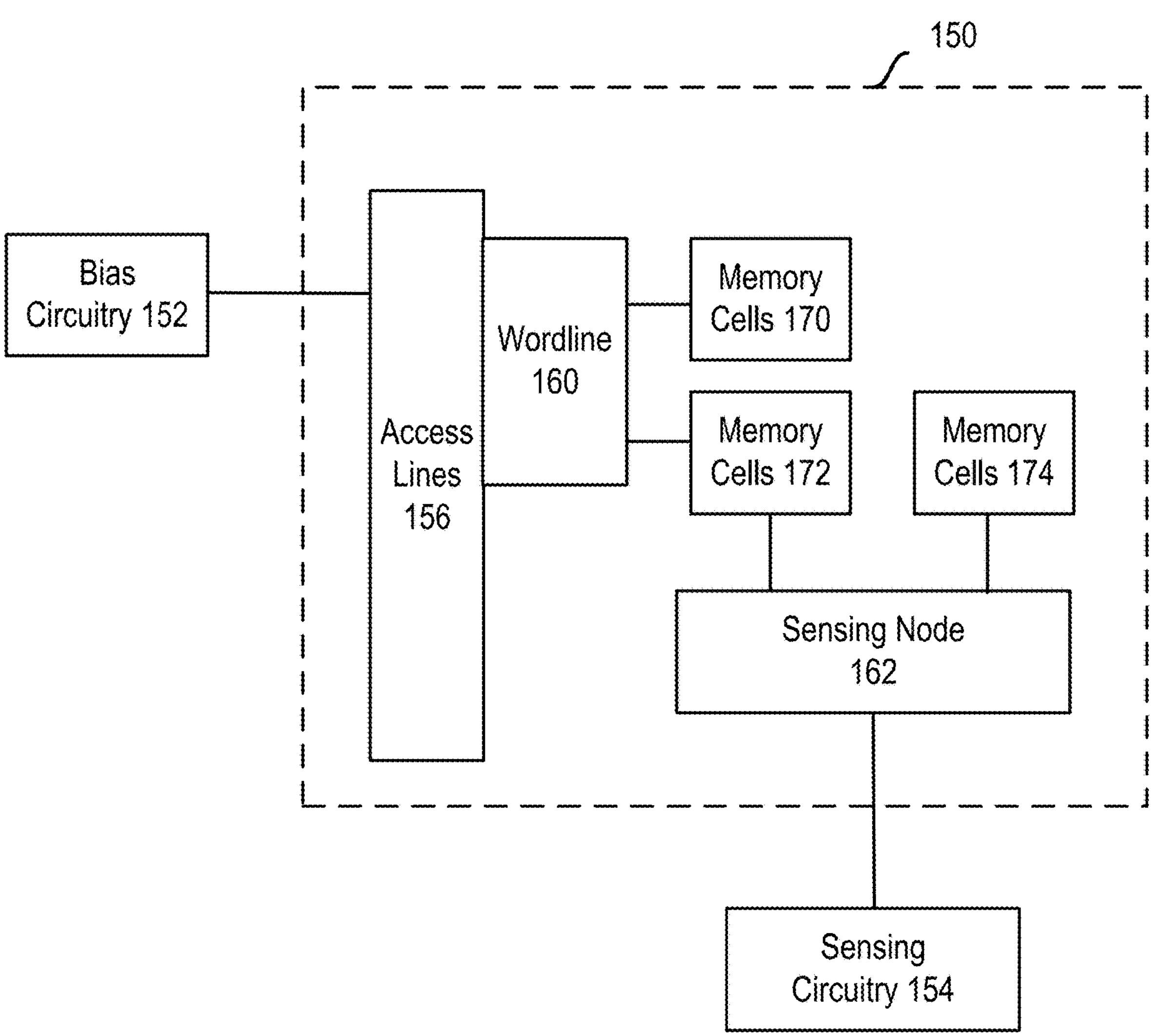
FIG. 2 shows a memory array having memory cells accessed using a common wordline, in accordance with some embodiments.

FIG. 2 shows a memory array 150 having memory cells accessed using a common wordline 160, in accordance with some embodiments. For example, memory cells 170, 172 are sequentially accessed using the same common wordline 160. In one example, memory cells 170 are accessed using a first set of digit lines (not shown) for a first read operation, and then memory cells 172 are accessed using a second set of digit lines (not shown) for a second read operation that immediately follows the first read operation. When operating in a streaming mode, the voltage of wordline 160 is kept biased between the first and second read operations. Specifically, in preparation for the second read operation the voltage of wordline 160 is returned to the same initial voltage (e.g., in preparation for a read voltage ramp) as used in the first read operation. In other words, the voltage of wordline 160 is not returned to an idle mode voltage because wordline 160 will be used again immediately in the second read operation.

Memory cells 170, 172 are an example of data cells 110. Bias circuitry 152 biases access lines 156 to access various memory cells in memory array 150. For example, access lines 156 include wordlines such as wordline 160 and digit lines (not shown). Bias circuitry 152 can be similar to bias circuitry 124.

In one embodiment, during a read operation, memory cells 172 and 174 are sequentially accessed using access lines 156. Sensing circuitry 154 senses a state of memory cells 172 for a first read operation, and a state of memory cells 174 for a second read operation. Sensing node 162 is coupled to each of memory cells 172 and 174. Sensing circuitry 154 senses a state of sensing node 162 when reading memory cells 172 or 174. Because sensing node 162 is used in both the first and second read operations, for those memory cells that do not switch, sensing node 162 is not discharged between read operations. Instead, a bias is maintained on sensing node 162 after forming the first read operation in preparation for performing the second read operation. In other words, sensing node 162 is not returned to an idle state. Sensing circuitry 154 can be similar to sensing circuitry 122.

In one embodiment, bias circuitry 152 applies voltages when performing read and/or write operations. A controller (not shown) (e.g., controller 120) receives a command associated with first and second addresses, wherein the first address corresponds to first memory cells 170 of the memory array 150, and the second address corresponds to second memory cells 172 of the memory array 150.

The controller determines (e.g., using address map 104) that the first and second memory cells are accessed using at least one common node (e.g., wordline 160). In response to receiving the command, bias circuitry 152 biases at least one access line 156 used to access the first memory cells 170 to an initial state in preparation for reading or writing the first memory cells 170.

After biasing the access line to the initial state, the controller reads or writes the first memory cells 170. After reading or writing the first memory cells 170, bias circuitry 152 biases the access line to the initial state in preparation for reading or writing the second memory cells 172. Then, the controller reads or writes the second memory cells 172. In one example, the read data is sent to host device 126.

Figure 3:
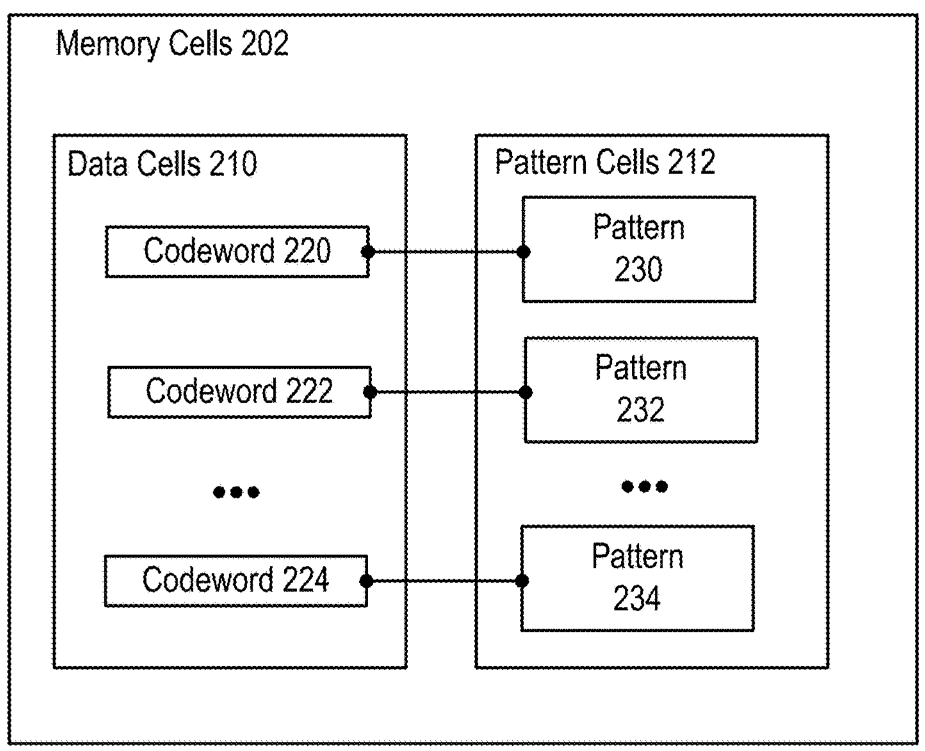
FIG. 3 shows stored codewords where each codeword is associated with reference patterns, in accordance with some embodiments.

FIG. 3 shows stored codewords where each codeword is associated with reference patterns, in accordance with some embodiments. Memory cells 202 includes data cells 210 and pattern cells 212. In one example, memory array 102 includes memory cells 202. Data cells 210 is an example of data cells 110, and pattern cells 212 is an example of pattern cells 112.

The codewords are stored in data cells 210, and the associated reference patterns are stored in pattern cells 212. For example, codeword 220 is associated with pattern 230; codeword 222 is associated with pattern 232; and codeword 224 is associated with pattern 234. In one example, pattern 230 is added to codeword 220 as codeword 220 is written by controller 120.

In one embodiment, a streaming mode is used as each codeword is written. In one example, pattern 230 initially contains all logic ones.

In one example, when reading codeword 222, pattern 232 is read to determine a number of memory cells in pattern 232 that snap. The voltage at which the number of cells that snap reaches a threshold is used by a controller to determine a read voltage for reading codeword 222.

In one embodiment, codeword 222 is read by applying a voltage ramp to a wordline starting with an initial voltage. When using a streaming mode to read codeword 224 in a next read operation, the same wordline is used and is kept biased to at least the initial voltage in preparation for reading codeword 224. In one example, codeword 224 is a block of data in a storage device.

Figure 4:
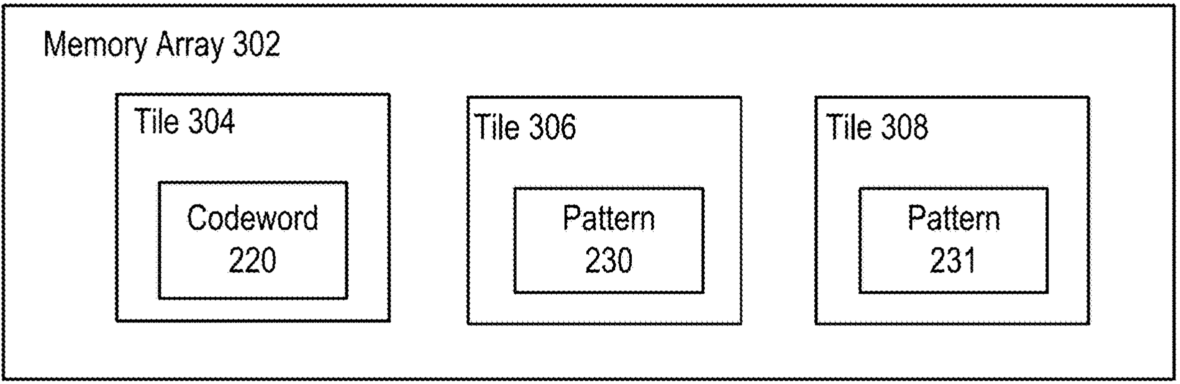
FIG. 4 shows an example of tiles in a memory array that store codewords and reference patterns, in accordance with some embodiments.

FIG. 4 shows an example of tiles in a memory array 302 that store codewords and reference patterns, in accordance with some embodiments. Memory array 302 is an example of memory array 102. Memory array 302 includes tiles 304, 306, 308. Tile 304 stores codeword 220, and tile 306 stores pattern 230. Tile 308 optionally stores an additional pattern 231 associated with codeword 220. In one example, memory cells in tiles 304, 306, 308 are selected using a common wordline (e.g., wordline 160).

Figure 5:
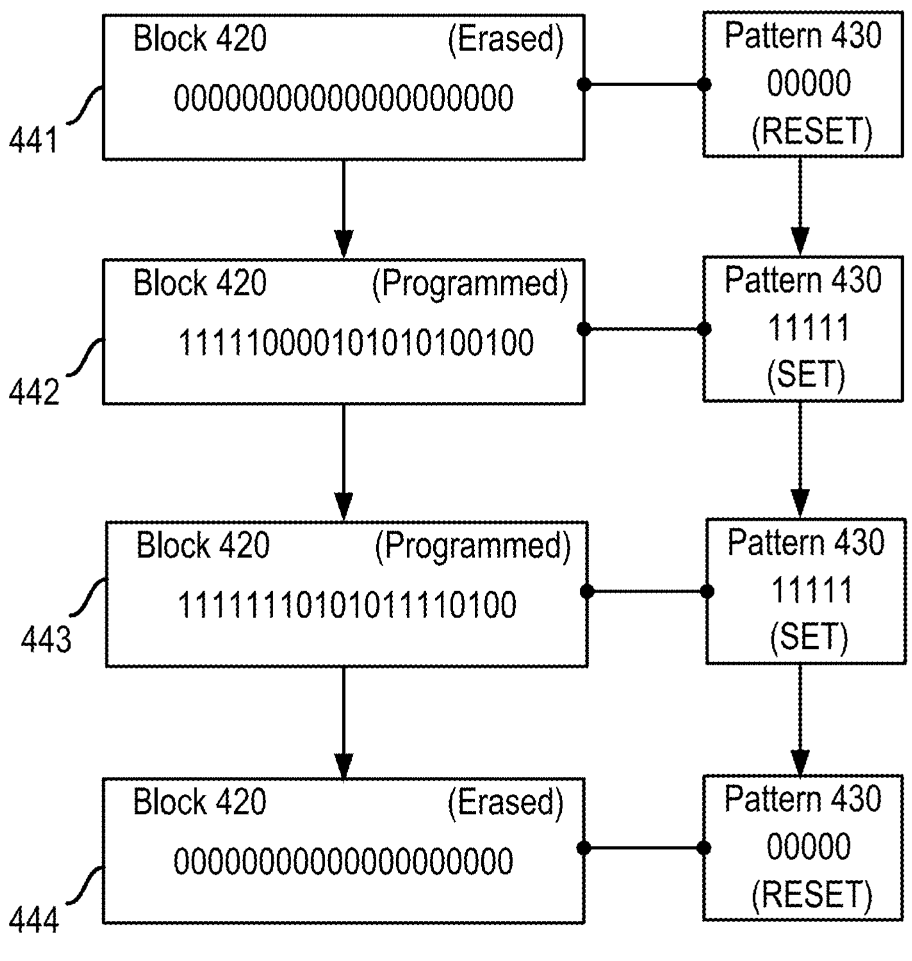
FIG. 5 shows exemplary stages of erase and program operations for a block of user data, in accordance with some embodiments.

FIG. 5 shows exemplary stages 441, 442, 443, 444 of erase and program operations for a block 420 of user data, in accordance with some embodiments. Block 420 is an example of codeword 224 in FIG. 3. In one example, block 420 is one of many blocks accessed by a controller for a host device storing data in a solid-state drive. The controller accesses the blocks using logical block addresses (LBAs) received from the host device. In one example, all memory cells in block 420 must be erased in a single operation. However, memory cells in block 420 can be individually programmed.

For example, at stage 441, block 420 is in a fully-erased state with all memory cells being logic zeros (a RESET state). Pattern 430 is associated with block 420. Pattern 430 has pattern cells all as logic zeros corresponding to a RESET state. Pattern 430 is an example of pattern 234.

For example, at stage 442, block 420 has been programmed. This is the first programming of block 420 subsequent to block 420 being erased. The memory cells of pattern 430 have been programmed to all logic ones corresponding to a SET state. At stage 443, block 420 is programmed again. Pattern 430 remains as all logic ones. At stage 444, block 420 is erased. Pattern 430 is changed from logic ones to logic zeros.

Figure 6:
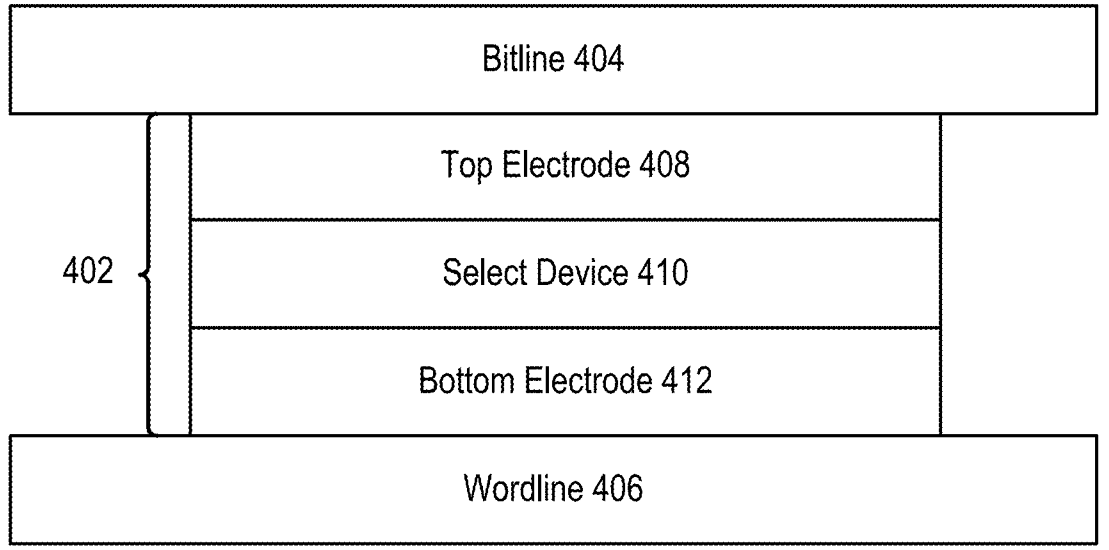
FIG. 6 shows an example of a memory cell that includes a select device, in accordance with some embodiments.

FIG. 6 shows an example of a memory cell 402 that includes a select device, in accordance with some embodiments. In one example, select device 410 includes a chalcogenide. Memory cell 402 is an example of data cells 110 and/or pattern cells 112.

Top electrode 408 conductively connects select device 410 to bitline 404, and bottom electrode 412 conductively connects select device 410 to wordline 406. In one example, electrodes 408, 412 are formed of a carbon material.

In one example, select device 410 includes a chalcogenide (e.g., chalcogenide material and/or chalcogenide alloy). Threshold voltage properties of the select device may be based on the voltage polarities applied to the memory cell.

In one example, a logic state may be written to memory cell 402, which may correspond to one or more bits of data. A logic state may be read from or written to the memory cell by applying voltages of different polarities at different voltage and/or current magnitudes. The reading and writing protocols may take advantage of different threshold voltages of the select device that result from the different polarities. In other words, when the memory cell is a self-selecting memory cell implemented using a selector/memory device, the select device 410 may be used as both a selecting element and a storage element of the cell 402.

Figures 7, 8:
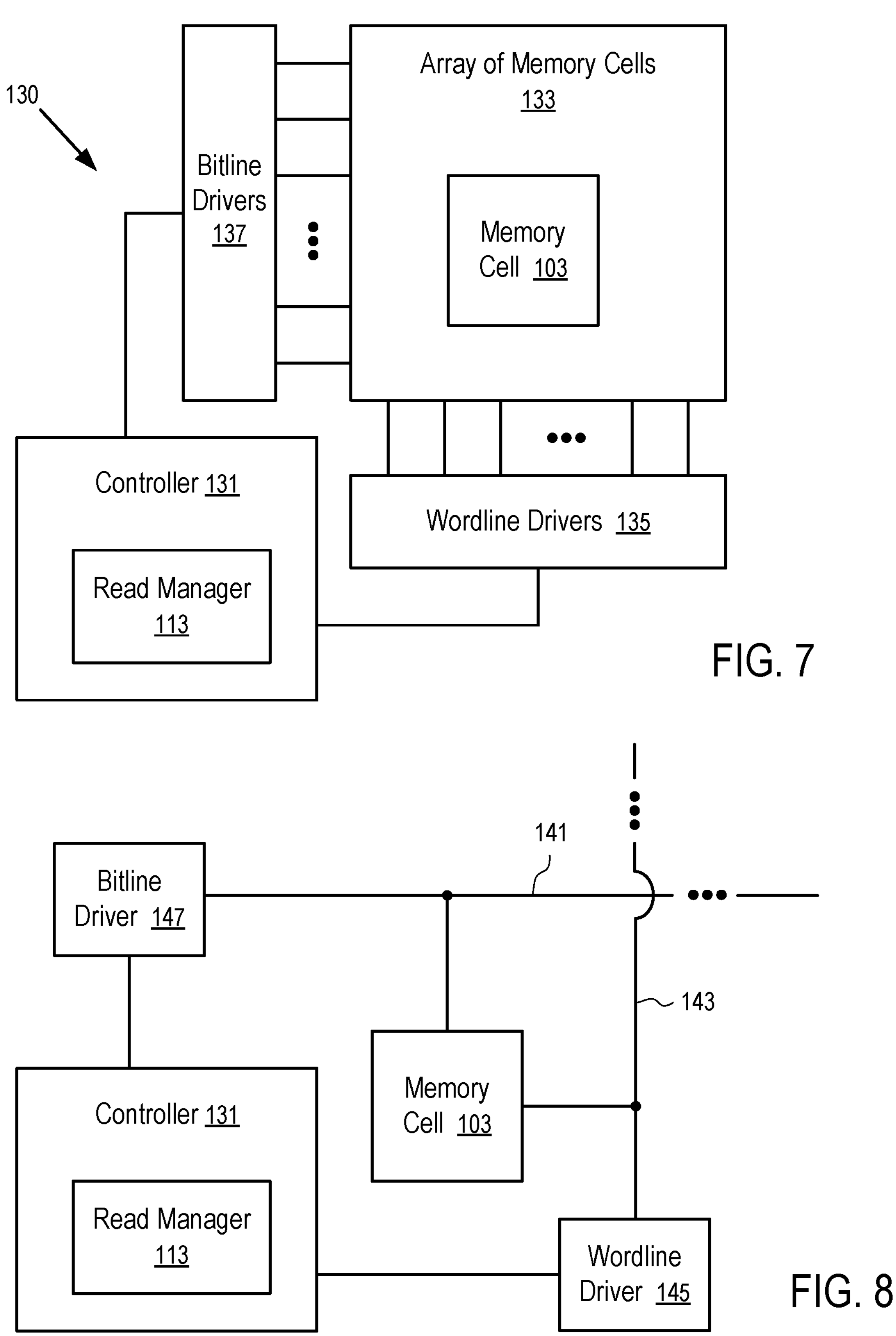
FIG. 7 shows a memory device configured with a read manager to determine whether to access memory cells in a memory array using either a streaming mode or a default/random mode, according to one embodiment.
FIG. 8 shows a memory cell with a bitline driver and a wordline driver configured to apply voltages, according to one embodiment.

FIG. 7 shows a memory device 130 configured with a read manager 113 to determine whether to access memory cells in a memory array using either a streaming mode or a default mode (e.g., random mode), according to one embodiment. Memory device 130 is an example of memory device 101. In FIG. 7, the memory device 130 includes an array 133 of memory cells, such as a memory cell 103. Memory cell 103 is an example of data cell 110, or pattern cell 112.

In one example, an array 133 can be referred to as a tile; and a memory device (e.g., 130) can have one or more tiles. Different tiles can be operated in parallel in a memory device (e.g., 130).

For example, the memory device 130 illustrated in FIG. 7 can have a cross-point memory having at least the array 133 of memory cells (e.g., 103). In another example, the memory device 130 illustrated in FIG. 7 can have a 3D vertical architecture having at least the array 133 of memory cells (e.g., 103).

In some implementations, the cross-point memory uses a memory cell 103 that has an element (e.g., a sole element) acting both as a selector device and a memory device. For example, the memory cell 103 can use a single piece of alloy with variable threshold capability. The read/write operations of such a memory cell 103 can be based on thresholding the memory cell 103 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 7 includes a controller 131 that operates bitline drivers 137 and wordline drivers 135 to access the individual memory cells (e.g., 103) in the array 133.

For example, each memory cell (e.g., 103) in the array 133 can be accessed via voltages driven by a pair of a bitline driver 147 and a wordline driver 145, as illustrated in FIG. 8.

The controller 131 includes a read manager 113 configured to implement a process that determines whether to implement a streaming mode (e.g., as described above). In one example, read manager 113 makes this determination based on addresses associated with read commands received from a host device. In one example, these addresses are compared to address map 104 to make the determination.

In one embodiment, read manager also determines one or more read voltages for reading data cells based on data obtained from applying voltages to patterns (e.g., 230) of pattern cells. The read manager 113 can be implemented, for example, via logic circuits and/or microcode/instructions. For example, during a read retry, the read manager 113 uses a read voltage having a magnitude larger than a read voltage previously used to read the memory cell (e.g., 103). The increase in the read voltage can be based on reading pattern cells (e.g., counting snaps of pattern cells). The read voltage with the increased magnitude applied to the memory cell (e.g., 103) can be sufficient to obtain the error free data from the memory cell (e.g., 103).

FIG. 8 shows a memory cell 103 with a bitline driver 147 and a wordline driver 145 configured to apply voltages (e.g., ramps) according to one embodiment. For example, the memory cell 103 can be a typical memory cell 103 in the memory cell array 133 of FIG. 7.

The bitline driver 147 and the wordline driver 145 of FIG. 8 are controlled by the read manager 113 of the controller 131 to selectively apply one or more voltages to the memory cell 103. The bitline driver 147 and the wordline driver 145 can apply voltages of different polarities on the memory cell 103.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 103 is in both the row connected to the bitline 141 and the column connected to the wordline 143. Thus, the memory cell 103 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 103 is subjected to a voltage in one polarity (e.g., positive polarity); and when the voltage driven by the bitline driver 147 is lower than the voltage driven by the wordline driver 145, the memory cell 103 is subjected to a voltage in the opposite polarity (e.g., negative polarity).

In some implementations, the memory cell 103 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms.

The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 103 can take the form of a crystalline atomic configuration or an amorphous atomic configuration. The threshold voltage of the memory cell 103 can be dependent on the ratio of the material in the crystalline configuration and the material of the amorphous configuration in the memory cell 103. The ratio can change under various conditions (e.g., having currents of different magnitudes and directions going through the memory cell 103).

A self-selecting memory cell 103, having a selector/memory device, can be programmed to have a threshold voltage window. The threshold voltage window can be created by applying programming pulses with opposite polarity to the selector/memory device. For example, the memory cell 103 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 103, the bitline driver 147 and the wordline driver 145 can drive a pulse of voltage onto the memory cell 103 in one polarity (e.g., positive polarity) to snap the memory cell 103 such that the memory cell 103 is in a conductive state. While the memory cell 103 is conductive, the bitline driver 147 and the wordline driver 145 continue driving the programming pulse to change the threshold voltage of the memory cell 103 towards a voltage region that represents the data or bit value(s) to be stored in the memory cell 103.

In one embodiment, the controller 131 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 103 is connected to a bitline driver 147 and a wordline driver 145.

In one embodiment, the threshold voltage of a typically memory cell 103 is configured to be sufficiently high such that when only one of its bitline driver 147 and wordline driver 145 drives a voltage in either polarity while the other voltage driver holds the respective line to the ground, the magnitude of the voltage applied across the memory cell 103 is insufficient to cause the memory cell 103 to become conductive. Thus, addressing the memory cell 103 can be performed via both of its bitline driver 147 and wordline driver 145 driving a voltage in opposite polarity relative to the ground for operating/selecting the memory cell 103. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 103) connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory can also be used. For example, memory cells each having a selector device and a phase-change memory device and/or flash memory cells can also be used in at least some embodiments. Additionally or alternatively, the memory can have a different architecture, such as a 3D vertical architecture.

Figure 9:
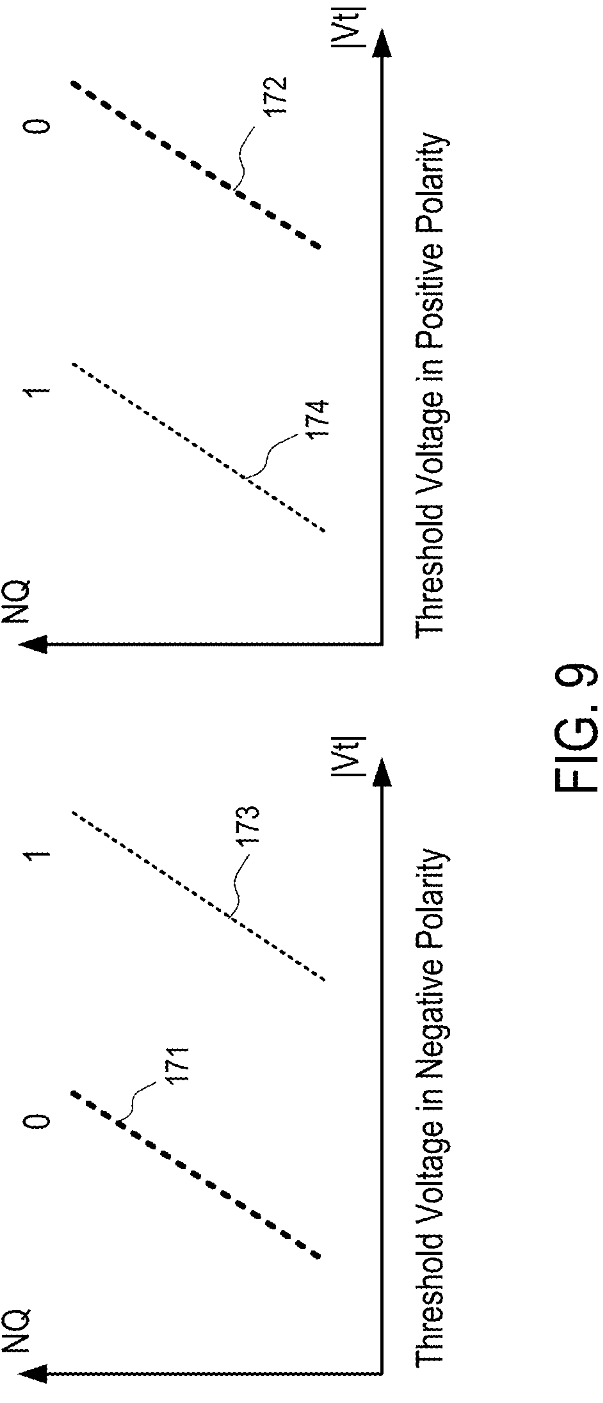
FIG. 9 shows an exemplary normal quantile (NQ) plot representing the statistical distributions of threshold voltages of memory cells.

FIG. 9 shows an exemplary normal quantile (NQ) plot representing the statistical distributions (e.g., 171-174) of threshold voltages of memory cells. In one example, the memory cells are data cells 110, and/or pattern cells 112. When a probability distribution (e.g., 171) of threshold voltages programmed in a region is a normal distribution (also known as Gaussian distribution), its normal quantile (NQ) plot is seen as aligned on a straight line (e.g., distribution 171).

A self-selecting memory cell (e.g., 103) can have a threshold voltage in negative polarity and a threshold voltage in positive polarity. When a voltage applied on the memory cell 103 in either polarity is increased in magnitude up to its threshold voltage in the corresponding polarity, the memory cell (e.g., 103) switches (e.g., snaps) from a non-conductive state to a conductive state.

The threshold voltage of a memory cell 103 in negative polarity and the threshold voltage of the memory cell 103 in positive polarity can have different magnitudes. Memory cells programmed to have large magnitudes in threshold voltages in positive polarity can have small magnitudes in threshold voltages in negative polarity; and memory cells programmed to have small magnitudes in threshold voltages in positive polarity can have large magnitudes in threshold voltages in negative polarity.

For example, a memory cell can be programmed to have a small magnitude in threshold voltage according to distribution 174 in the positive polarity to represent a value (e.g., one); and as a result, its threshold voltage has a large magnitude according to distribution 173 in the negative polarity to represent the same value (e.g., one). Alternatively, the memory cell can be programmed to have a large magnitude in threshold voltage according to distribution 172 in the positive polarity to represent another value (e.g., zero); and as a result, its threshold voltage has a smaller magnitude according to distribution 171 in the negative polarity to represent the same value (e.g., zero).

Thus, to determine whether a memory cell 103 is storing the one value (e.g., one) or the other value (e.g., zero), the read manager 113 can read the memory cell 103 in either the positive polarity or the negative polarity. If the threshold voltage of the memory cell 103 has a large magnitude according to distribution 172 in the positive polarity, it stores the other value (e.g., zero); otherwise, it stores the one value (e.g., one). Similarly, if the threshold voltage of the memory cell 103 has a large magnitude according to distribution 173 in the negative polarity, it stores the one value (e.g., one); otherwise, it stores the other value (e.g., zero).

The threshold voltage distributions of memory cells may change after a read. For example, in the positive polarity, a read can cause the high magnitude distribution 172 to shift downward, and/or the low magnitude distribution 174 to shift downward.

Similarly, in negative polarity, the read can cause the high magnitude distribution 173 to shift downward, and/or the low magnitude distribution 171 to shift downward.

Figure 10:
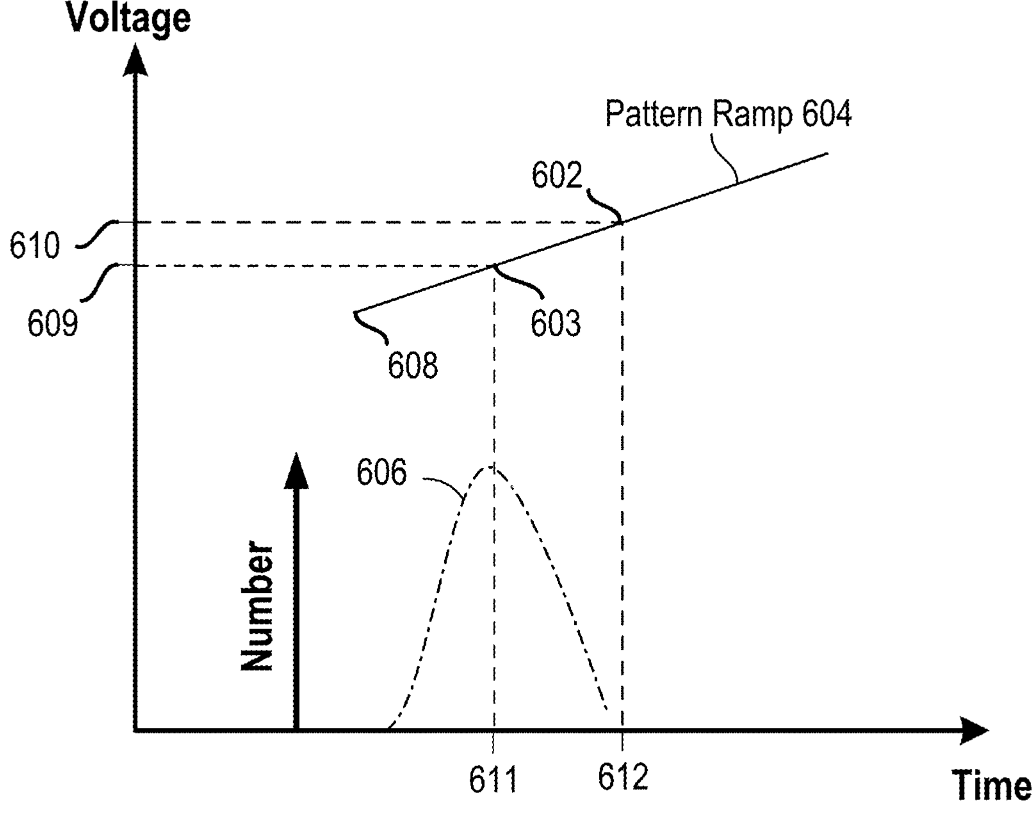
FIG. 10 shows an exemplary pattern cell snapping distribution for a pattern ramp applied to a reference pattern in a memory array, in accordance with some embodiments.

FIG. 10 shows an exemplary pattern cell snapping distribution 606 for a pattern ramp 604 applied to a reference pattern in a memory array, in accordance with some embodiments. In one example, the memory array is memory array 102. In one example, pattern ramp 604 is applied in magnitudes of equal or different voltages to each of patterns 103, 105 of FIG. 1.

Pattern cell distribution 606 illustrates a number (vertical axis) of memory cells that switch over time (horizontal axis) as pattern ramp 604 is applied to pattern cells in one of patterns 103 or 105. In one example, pattern ramp 604 (the vertical axis also shows the voltage of ramp 604) is applied starting at an initial voltage 608 and increasing in magnitude to point 602, which corresponds to a time 612 at which a threshold number (e.g., 62 cells) of the pattern cells have switched.

In one example, pattern ramp 604 is applied starting at an initial voltage 608 and increasing in magnitude to point 603, which corresponds to a time 611 at which a threshold number (e.g., 30 cells) of the pattern cells have switched. In one example, time 611 is the average (or within plus or minus 5-10% of the average) of pattern cell distribution 606.

In one embodiment, a controller counts a cumulative number of the pattern cells that switch. As illustrated, at point 602 on ramp 604 the controller determines that a threshold number of cells have snapped (e.g., 64 cells snap). Voltage 610 is the voltage applied at time 612, which is when the controller determines the threshold number is reached. In one embodiment, voltage 610 is used by the controller as a proxy for, or prediction of, a 1 cell threshold voltage distribution of data cells to be read.

In an alternative embodiment, at point 603 on ramp 604 the controller determines that a threshold number of cells have snapped (e.g., 35 cells snap). Voltage 609 is the voltage applied at time 611, which is when the controller determines the threshold number is reached.

An initial read voltage for reading the data cells can be selected based on voltage 609 or 610 (and/or other voltages along pattern ramp 604). An initial voltage applied to a wordline (e.g., initial voltage for a wordline ramp) and/or an initial voltage applied to a digit line can be selected based on this selected initial read voltage.

Figure 11:
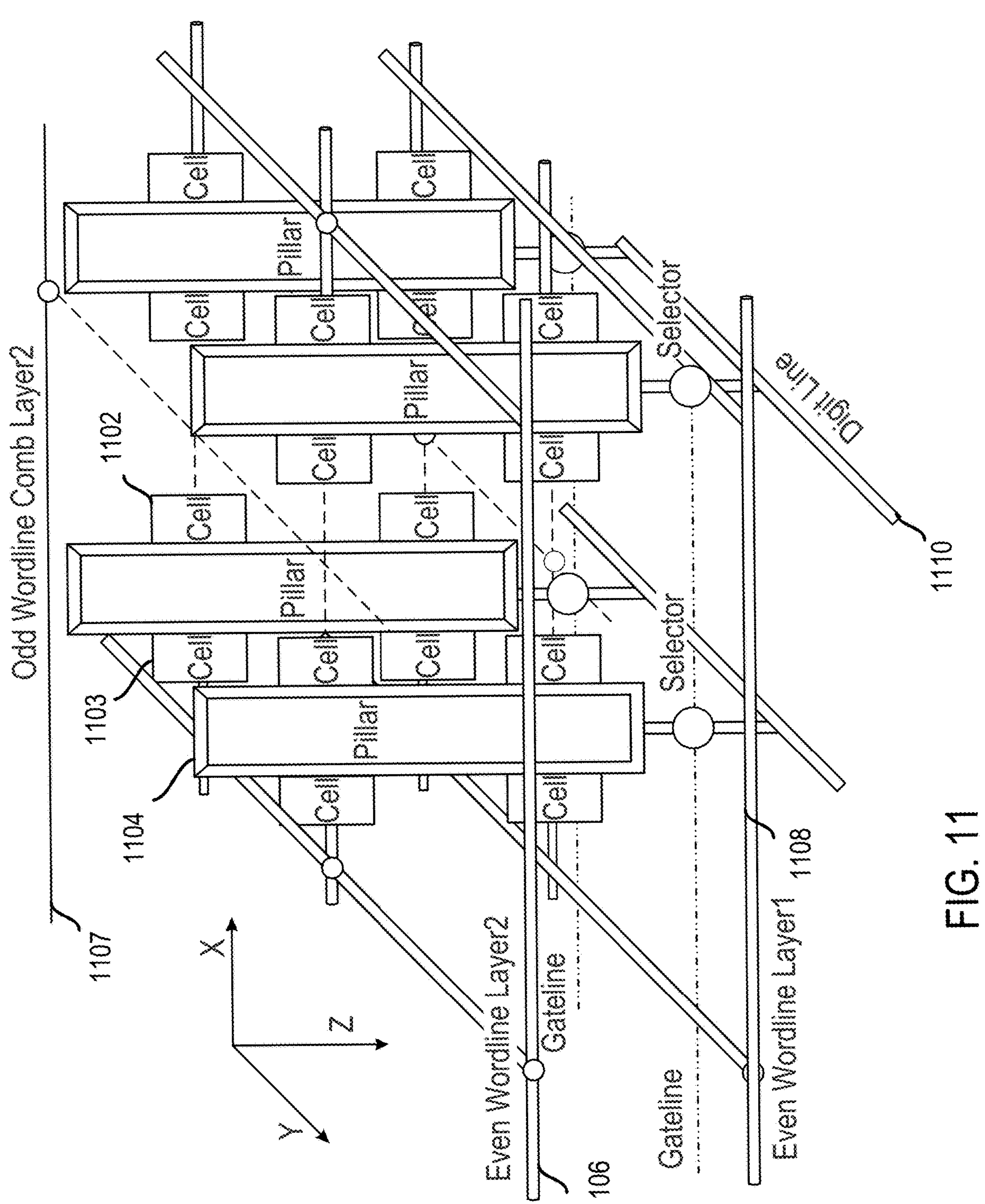
FIG. 11 shows an exemplary three-dimensional memory array structure having wordlines configured in a comb structure, in accordance with some embodiments.

FIG. 11 shows an exemplary three-dimensional memory array structure having wordlines configured in a comb structure, in accordance with some embodiments. The memory array and memory cells described herein are not limited to use in a planar architecture (e.g., with cells at crossing of wordlines (WLs) and bitlines (BLs) on different levels). Instead, the approach also can be used for vertical architectures (e.g., vertical BL pillars crossing horizontal WL planes).

An example of a vertical architecture that can be used with embodiments described in this disclosure is illustrated in FIG. 11. As illustrated, a memory array includes memory cells 1102, 1103. Each memory cell 1102, 1103 can be selected using a wordline (e.g., 1106, 1107, or 1108) and a digit line (e.g., 1110). Memory cells 1102, 1103 are an example of data cells 110 or pattern cells 112 of FIG. 1.

In one embodiment, each wordline extends in one of a plurality of horizontal planes of wordlines 1106, 1107, 1108 stacked vertically above a semiconductor substrate (not shown). Each digit line or bitline (e.g., 1110) includes a pillar 1104. Each pillar 1104 extends vertically away from the semiconductor substrate. Each memory cell 1102, 1103 is located on sides of one of pillars 1104.

In one embodiment, the memory array has a vertical array architecture comprising vertical bitlines (e.g., vertical pillars 1104) or digit lines intersecting a plurality of horizontal decks of wordlines (e.g., even wordlines 1106 and odd wordlines 1107). Each deck is configured as two interdigitated wordline combs so that each bitline or digit line forms two cells 1102, 1103 at each of the decks. In one example, even wordlines 1106 are interdigitated with odd wordlines 1107 in a comb structure as illustrated.

Figure 12:
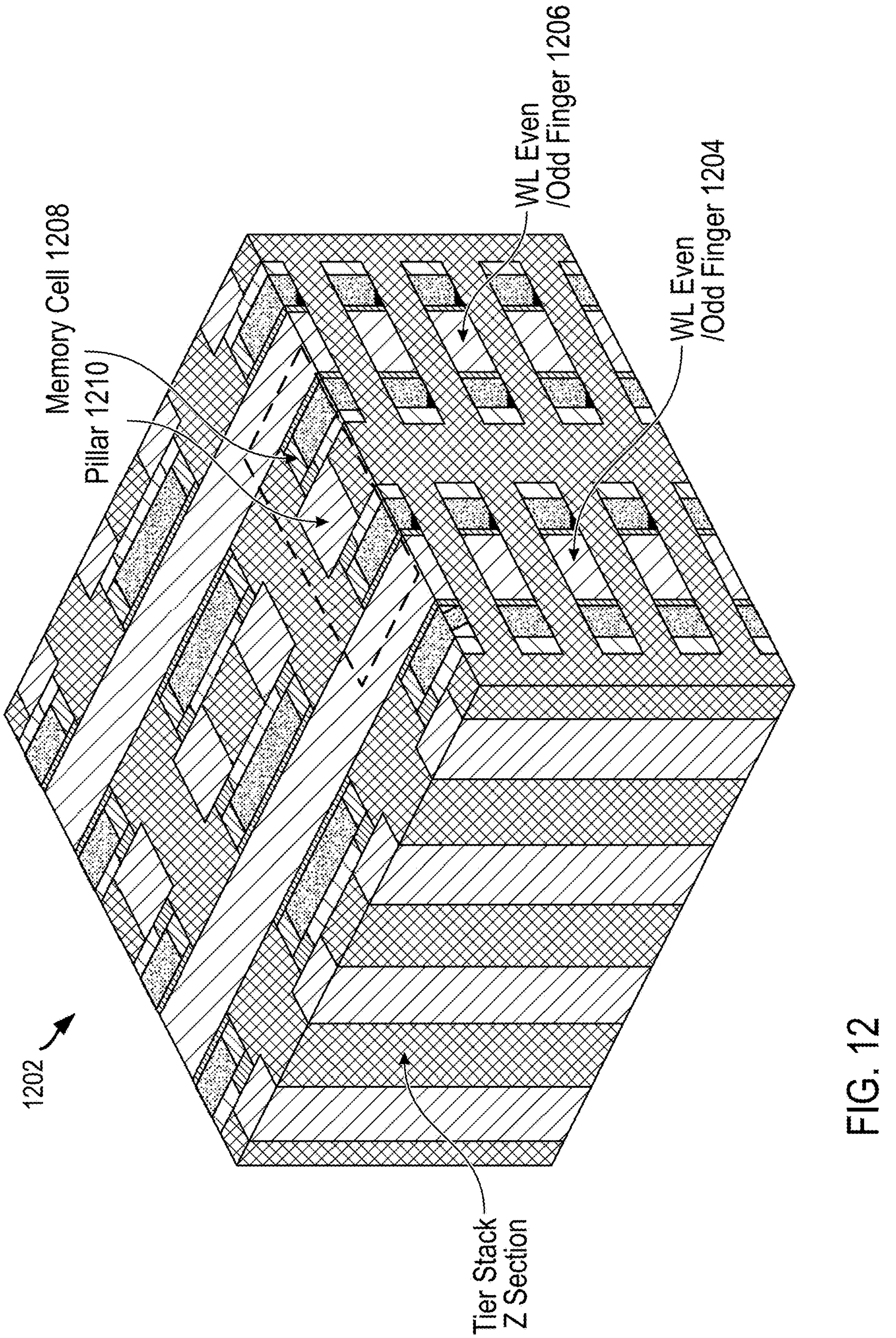
FIG. 12 shows an exemplary vertically integrated three-dimensional memory array (e.g., a cross-point memory array) having wordline fingers, in accordance with some embodiments.

FIG. 12 shows an exemplary vertically integrated three-dimensional memory array 1202 (e.g., a three-dimensional cross-point memory array) having wordline fingers 1204, 1206, in accordance with some embodiments. Memory array 1202 is an example of memory array 102, 150. In one example, memory array 1202 is arranged in tiers in a manner similar to a replacement gate (RG) NAND flash memory.

In one embodiment, a conductive pillar 1210 in the Z direction collects the memory cells 1208 along all the pillars (two cells from each tier). The two cells connected to the same pillar 1210 are arranged into two separate small wordlines WLs (even and odd fingers 1204, 1206). The even (odd) wordlines WLs are connected at a tier edge creating a "comb-like" arrangement, as illustrated.

Figure 13:
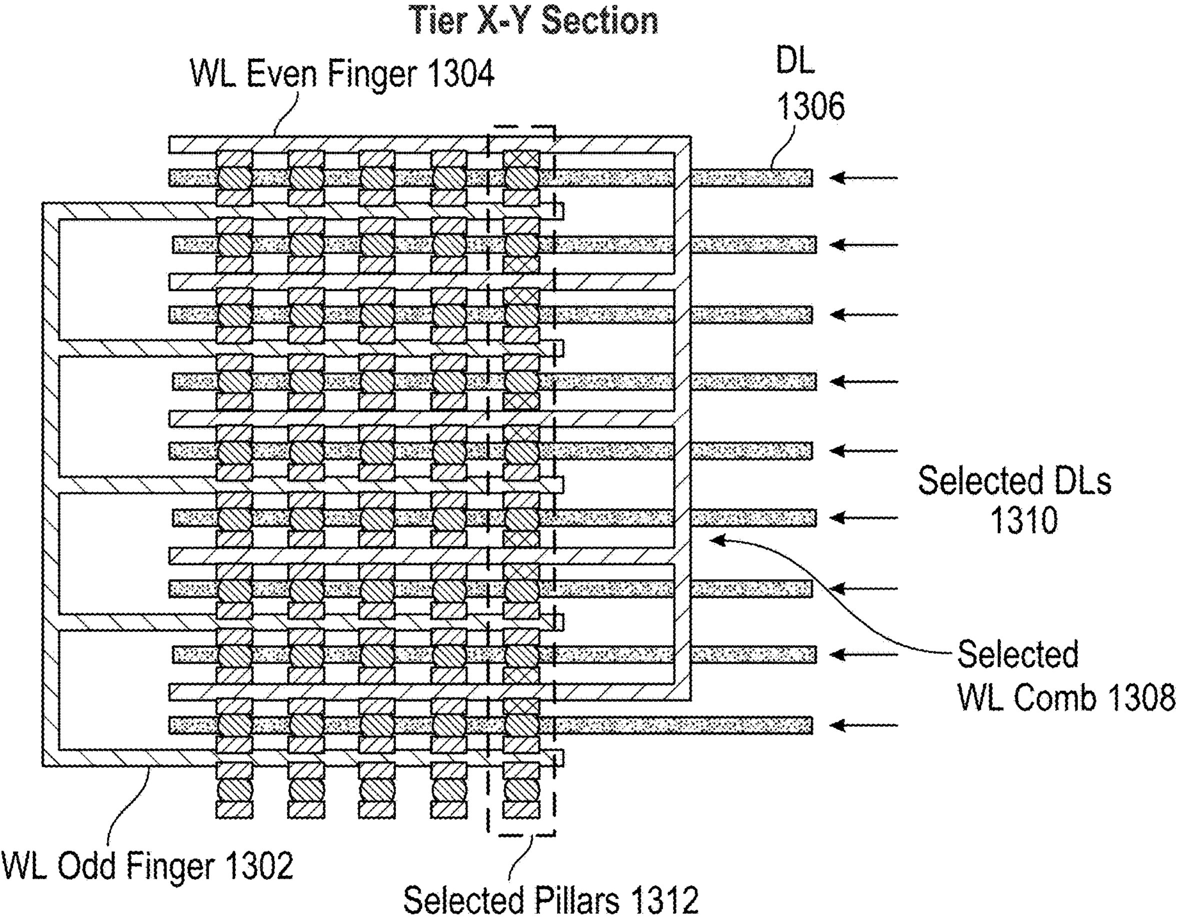
FIG. 13 shows a horizontal X-Y section of the memory array of FIG. 12 that illustrates interleaved even and odd wordline fingers, in accordance with some embodiments.

FIG. 13 shows a horizontal X-Y section of the memory array 1202 of FIG. 12 that illustrates interleaved even and odd wordline fingers 1302, 1304, in accordance with some embodiments. Various digit lines 1306 run horizontally below wordline fingers 1302, 1304.

A controller (not shown) applies a voltage to selected wordline comb 1308 and to selected digit lines 1310 to select memory cells for access. Applying the voltage to selected digit lines 1310 selects pillars 1312 for access to selected memory cells in the array.

Figure 14:
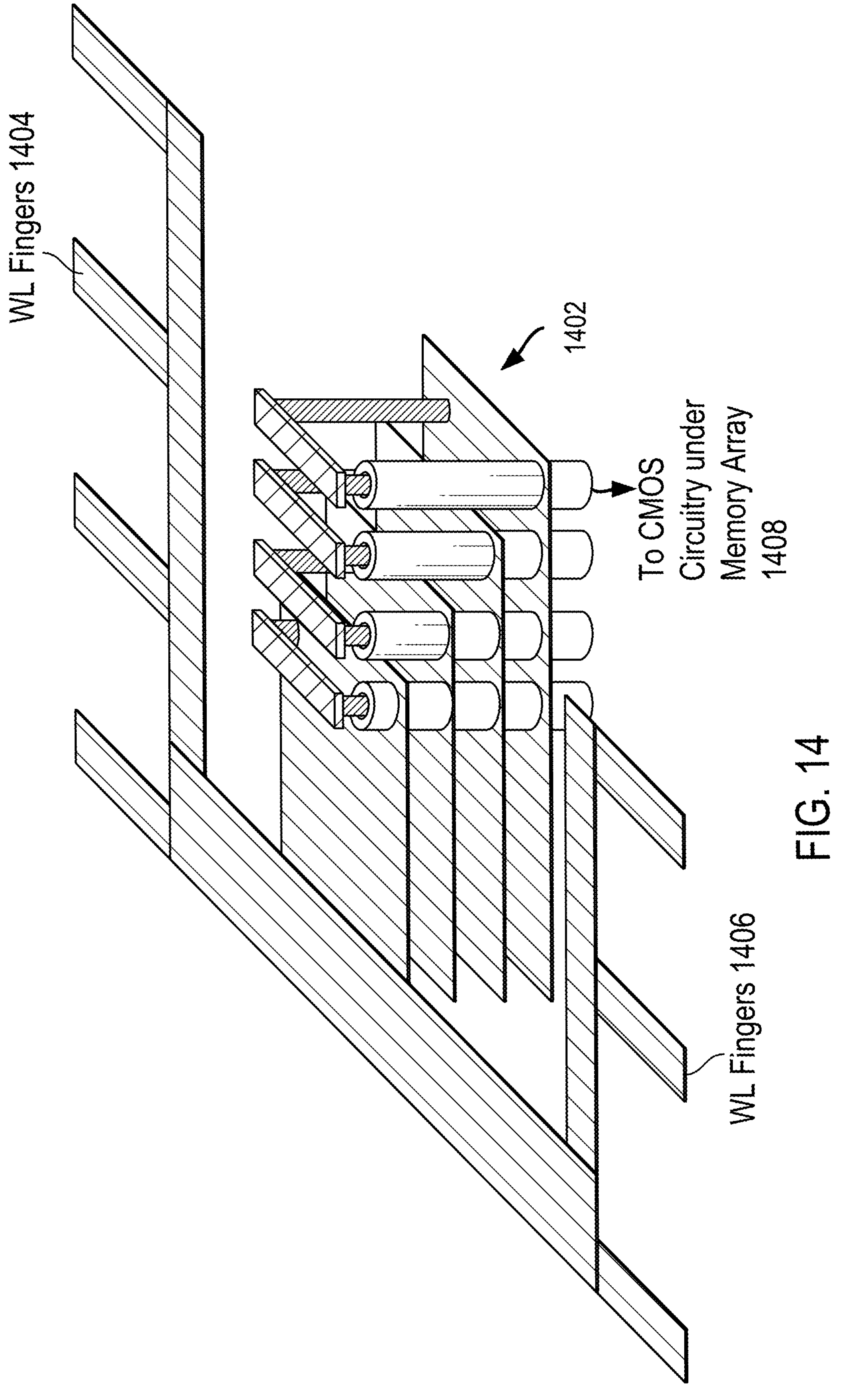
FIG. 14 shows wordline combs of the memory array of FIG. 12 that are electrically connected to CMOS circuitry underneath the memory array, in accordance with some embodiments.

FIG. 14 shows wordline combs of the memory array of FIG. 12 that are electrically connected to CMOS circuitry 1408 underneath the memory array, in accordance with some embodiments. The combs have wordline fingers 1404, 1406 and are connected to CMOS circuitry 1408 through a staircase 1402.

In one example, staircase 1402 connects to CMOS circuitry 1408 similarly as done for a replacement gate (RG) NAND memory device. In one example, selected wordline comb 1308 of FIG. 13 is connected to CMOS circuitry 1408 using staircase 1402.

Figure 15:
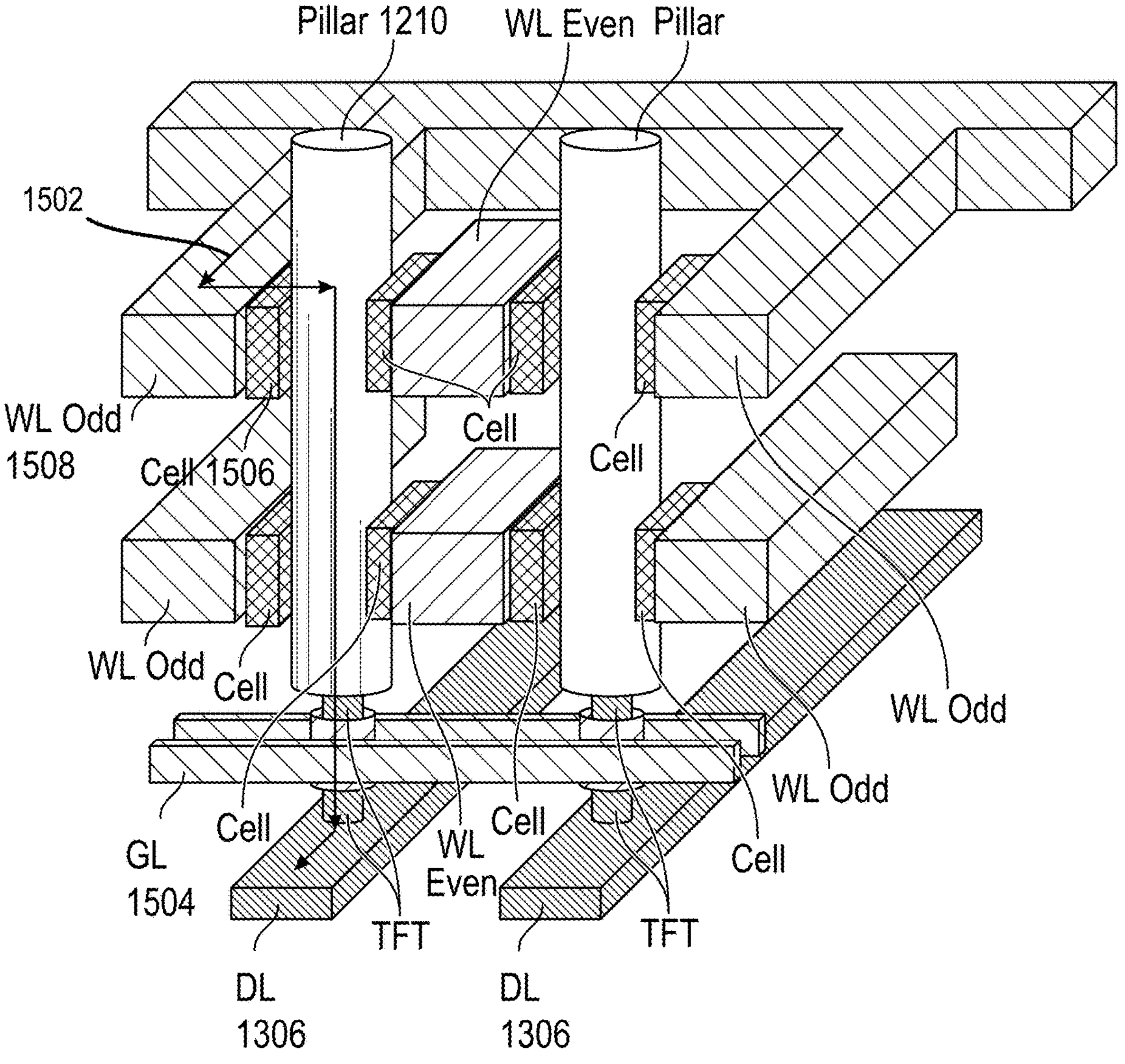
FIG. 15 shows memory cells located on the sides of vertical pillars of the memory array of FIG. 12, in accordance with some embodiments.

FIG. 15 shows memory cells located on the sides of vertical pillars 1210 of the memory array of FIG. 12, in accordance with some embodiments. The bottoms of pillars 1210 are collected in the same direction of the WL fingers (WL odd/even) by digit lines 1306 (DLs). To distinguish between different pillars, a thin-film transistor (TFT) selector is used at the pillar bottom and driven by a dedicated array line gate line 1504 (GL) in the orthogonal direction.

A circuit path 1502 that flows through memory cell 1506 is illustrated. Circuit path 1502 flows from wordline finger 1508 to memory cell 1506 to pillar 1210 to digit line 1306. In one embodiment, circuit path 1502 is used for sensing a current through memory cell 1506 when reading the cell.

Figure 16:
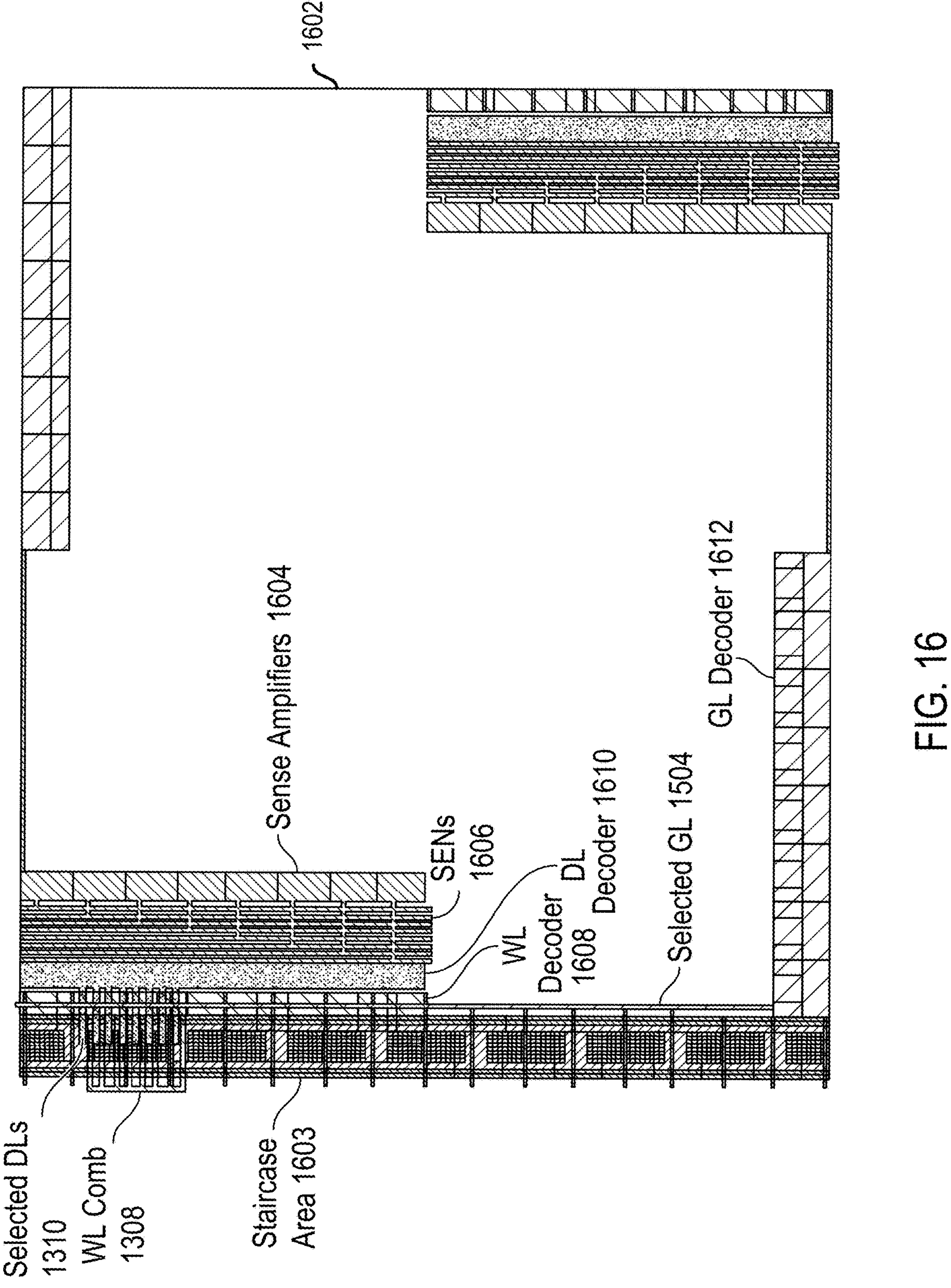
FIG. 16 shows exemplary decoders located under the memory array of FIG. 12, in accordance with some embodiments.

FIG. 16 shows exemplary decoders for a tile 1602 that are located under the memory array 1202 of FIG. 12, in accordance with some embodiments. The decoders include wordline decoder 1608, digit line decoder 1610, and gate line decoder 1612.

The selected digit lines (DLs) 1310 under the addressed wordline comb 1308 are connected to sense amplifiers 1604 (e.g., which are spread along the whole height of tile 1602 on the top left and bottom right sides). Sensing nodes 1606 (SENs) are coupled to sense amplifiers 1604 and to selected digit lines 1310 for reading selected memory cells. It should be noted that wordlines WL, gate lines GL, and sensing nodes SENs 1606 are, for example, highly-capacitive nodes, as described above. Various staircases 1402 connect wordlines to wordline decoders in staircase area 1603.

Figure 17:
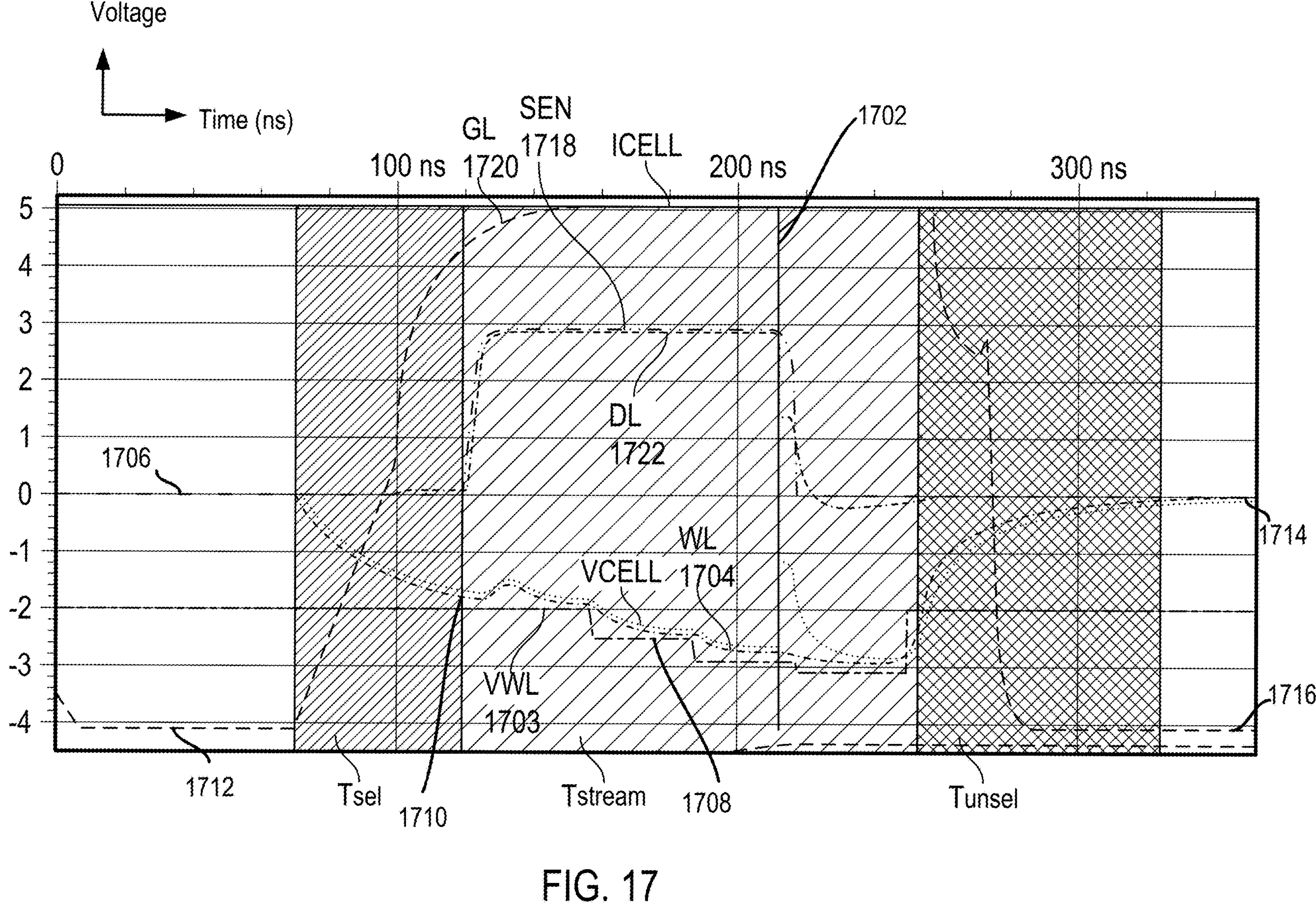
FIG. 17 shows a graph of various exemplary node voltages when accessing a memory device in a random mode, in accordance with some embodiments.

FIG. 17 shows a graph of various exemplary node voltages versus time when accessing a memory device in a random mode, in accordance with some embodiments. In one embodiment, this random mode is a default mode used by a controller unless the controller has activated a streaming mode (see e.g., FIG. 18). In one example, controller 120 reads memory array 102 using this random mode when read addresses are received from a host device (e.g., in a random manner or order).

In one embodiment, a read algorithm of a controller starts with the selection of a target wordline WL 1704 and gate line GL 1720. This selection is done in a selection phase (Tsel phase). Once the wordline and gate line are properly biased in preparation for a read, a target digit line DL 1722 is precharged by biasing to a voltage of increased magnitude as illustrated. Prior to selection, wordline 1704 starts at idle voltage 1706 (e.g., ground) and gate line 1720 starts at idle voltage 1712 (e.g., −4 V).

Then, the voltage of the wordline WL 1704 is ramped according to a selected algorithm that defines the type of ramp voltages to apply to the wordline. The wordline voltage is ramped in a reading phase (indicated by Tstream).

Bias circuitry (e.g., bias circuitry 124) applies a voltage VWL 1703 to the wordline 1704. In one example, the voltage of wordline 1704 starts at voltage 1706 in an idle mode, then during selection the voltage is biased to initial voltage 1710 in preparation for reading memory cells. Various incremental ramp voltages 1708 are applied to the wordline 1704 by the bias circuitry. The ramp continues until one or more memory cells have snapped (e.g., by time 1702) or until a maximum read voltage is achieved.

When the wordline voltage ramp ends, the memory array is biased again in an idle mode and the voltage of the wordline is returned to idle voltage 1714 (e.g., the wordline WL and gate line GL are unselected). The gate line 1720 is returned to idle voltage 1716. This is done in an unselection phase (Tunsel phase). As was discussed above, the wordline WL and gate line GL selection and unselection phases (and particularly the wordline) are significantly expensive from both a time and power perspective.

A sensing node SEN 1718 voltage is also illustrated. The sensing node voltage 1718 decreases at time 1702 due to the memory cell switching (e.g., snapping). Voltage VCELL illustrates a voltage on a representative memory cell.

Figure 18:
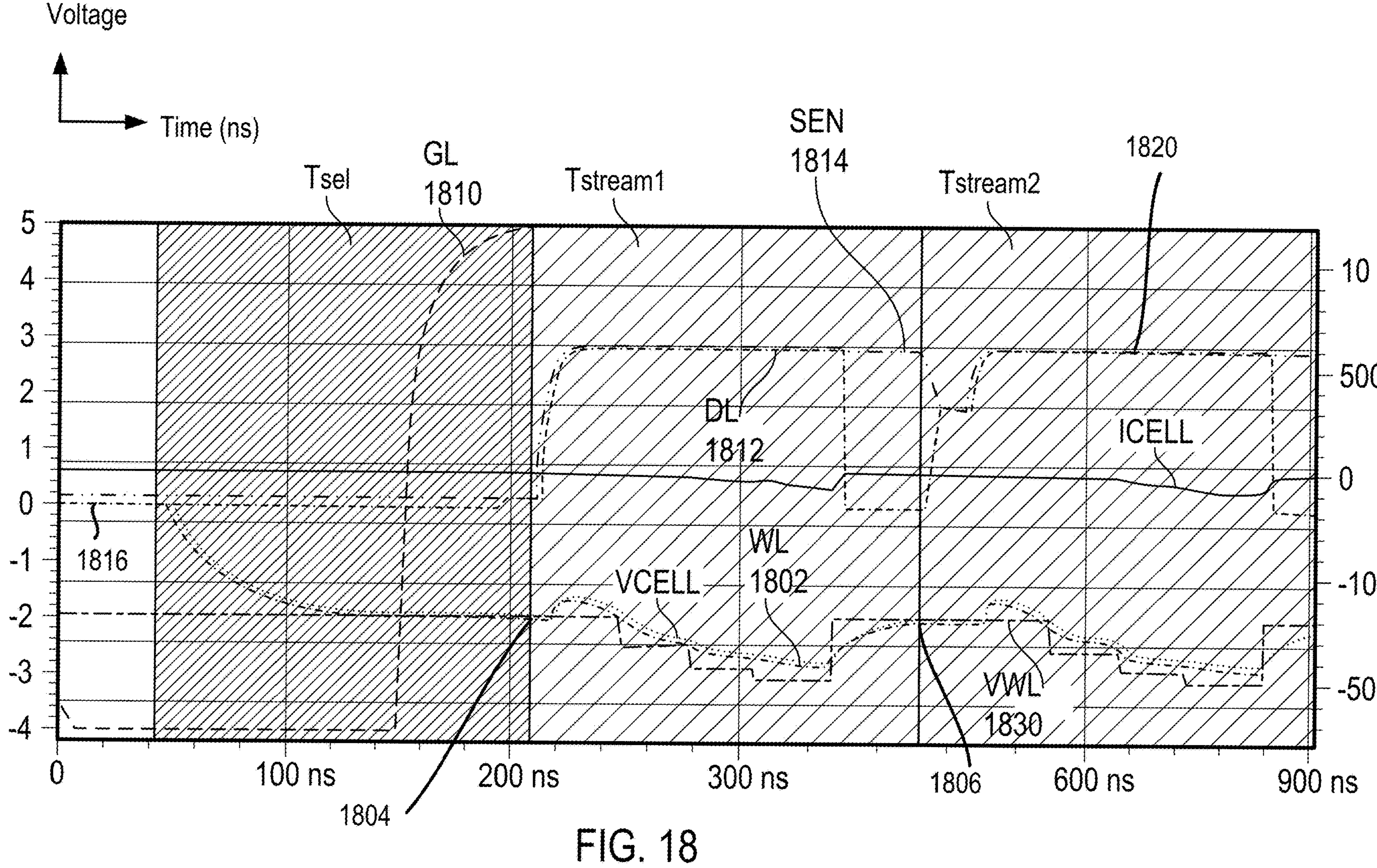
FIG. 18 shows a graph of various exemplary node voltages when accessing a memory device in a streaming mode, in accordance with some embodiments.

FIG. 18 shows a graph of various exemplary node voltages versus time when accessing a memory device in a streaming mode, in accordance with some embodiments. For example, controller 120 activates and then uses this streaming mode for reading memory cells.

The streaming read algorithm starts with the selection of a target wordline WL 1802 and gate line GL 1810 in a selection phase (Tsel phase) (e.g., similarly as for FIG. 17). Once the wordline WL 1802 and gate line GL 1810 are properly biased, the target digit line DL 1812 is precharged.

For example, wordline WL 1802 starts at idle voltage 1816 (e.g., ground), then is biased to initial read voltage 1804 (e.g., −2 V) for reading first memory cells in phase Tstream1. The bias is applied by connecting the wordline to bias circuitry having a supply voltage VWL 1830.

Then, the wordline WL 1802 is ramped according to the chosen algorithm (as illustrated for phase Tstream1) (e.g., similarly as for FIG. 17). When the ramp ends, the target wordline WL 1802 and gate line GL 1810 are kept biased (e.g., WL and GL are biased to the voltage needed at the beginning of a read ramp for the next read operation in phase Tstream2). In particular, the wordline WL and gate line GL are not returned to idle voltages after the first read operation Tstream1. This is in contrast to the random mode illustrated in FIG. 17, which enters an unselection phase (Tunsel) after the first read operation.

As illustrated, digit line DL 1812 indicates voltages on first digit lines read in the first Tstream1 phase. After this phase, the first digit lines are unselected. Then, second digit lines 1820 are biased for reading second memory cells in phase Tstream2.

For the next read operation that occurs in phase Tstream2, the voltage of wordline 1802 is biased and returned to initial voltage 1806 (e.g., −2 V). Wordline 1802 is not returned to an idle state because this next read operation will access memory cells using the same wordline 1802.

When all the desired codewords on the selected wordline WL 1802 and gate line GL 1810 have been read, the wordline WL and gate line GL are put again in idle mode. This can be done using an unselection phase Tunsel similar to FIG. 17 (not shown in FIG. 18). The unselection phase follows n successive Tstream read operations (1, 2, . . . , n). In one example, after memory cells for all digit lines on a common wordline have been read, the controller exits the streaming mode.

Sensing node SEN 1814 remains at a high voltage during reading phase Tstream1 because the illustrated representative memory cell (VCELL) does not switch. For the next reading phase Tstream2, sensing node SEN 1814 is kept biased at the high voltage (instead of being discharged).

By use of the streaming mode, power and time are saved as compared to using the random mode. For example, the power and time needed by the wordline WL and gate line GL selection and unselection phases is saved.

In one example, about 30% savings in energy is achieved. This savings is due in part reducing wordline decoding power, wordline charging power, gate line decoder power, and/or gate line charging power. Also, digit line decoder power and digit line charging can be reduced for those memory cells not switching (e.g., about 50% of memory cells). In such cases, the sensing node can remain charged for a next read operation to save power.

FIG. 19 shows parallel access to data using multiple partitions operating in a streaming mode or a random mode, in accordance with some embodiments. In one embodiment, the partitions are accessed in parallel to meet a bandwidth requirement of a host device. In one example, the multiple partitions are located in memory array 102, 150. In one example, the random mode corresponds to FIG. 17. In one example, the stream mode corresponds to FIG. 18.

As illustrated, a number of partitions Npart Stream in a streaming mode is less than a number of partitions Npart Random in a random mode for satisfying a given bandwidth. This is because the streaming mode requires fewer time periods for selection and unselection phases (Tsel and Tunsel) for a given data bandwidth.

In the streaming mode, each of partitions P0 to PN is accessed to read data after selection phase Tsel. The data read for each partition includes various stream units SUO, SU1, . . . , SUn. In one example, each of the stream units corresponds to one of the stream reading phases as illustrated in FIG. 18 (e.g., SU0 corresponds to Tstream1, SU1 corresponds to Tstream2). An unselection phase Tunsel follows the reading of multiple stream units for each partition.

In the random mode, each of partitions P0 to PN is accessed to read data after selection phase Tsel. Only a single stream unit is read between the selection phase Tsel and unselection phase Tunsel. In one example, this stream unit corresponds to the stream reading phase as illustrated in FIG. 17 (e.g., Tstream).

In one embodiment, a controller receives, from a host device, a read command. In response to receiving the read command, the controller reads data in parallel from partitions P0 to PN of a memory array. The controller determines to read the data using a streaming mode as described above. In one example, for partition P0, the data is read from first memory cells in SU0, and then next from second memory cells in SU1 using a common wordline. The read data is sent to the host device.

In one embodiment, each partition P0 to PN for either mode is a portion of memory array 102. Each partition includes all the circuitry needed to internally perform a particular operation (e.g., a read access).

In one embodiment, to meet a sustained bandwidth required by a host device, a certain number of partitions in a memory array are located or selected by a controller to satisfy this bandwidth. In one example, it is preferred to have a smaller number of partitions because this requires less area on a memory chip. By using a streaming mode, a particular bandwidth (e.g., requested by a host device) can be satisfied with a lower number of partitions than if using a random mode.

In one example, in a scenario for a storage device, a host device desires to receive 4 KB of data. In many cases, a single partition cannot provide all of this data in a single read. To build a codeword, multiple partitions P0 to PN are used. The codeword is split into different partitions. Each partition gives a portion of the codeword that is required by the host device. By making different partitions active at the same time, a memory device can provide more bandwidth than if only a single partition stores the codeword. Overall, the quantity of data provided in streaming mode is greater than in random mode for a given time period (because a Tunsel phase is not needed in streaming mode for each stream unit access).

In one embodiment, as illustrated in FIG. 19, the partitions are read in parallel in the streaming mode, but the start of reading for each partition is staggered in time. In one example, this is done because output pads of a memory device do not permit addressing output from all partitions at the same time. For example, there can be different addresses to the same partition. In one example, reading of each partition does not start at the same time due to potential problems with peak power consumption. A similar addressing and power constraint can also apply for reading in random mode.

In one embodiment, a host device defines a minimum atomic unit of information needed (e.g., Logical Block Address (LBA) in a storage device, or a page in a memory device). Since every tile can provide/manage a certain maximum number of bits in a certain time, this atomic unit defines the number of tiles which needs to be fired in each single access (Ntile_for_BW).

In a preferred case, all of these needed tiles are in the same partition. If the page size is too small, the number of tiles needed to guarantee a bandwidth BW is not sufficient to host the CMOS circuitry under the memory array (CuA) (e.g., CMOS circuitry 1408) of the partition (Ntile_for_CuA). Then, the number of tiles in the partition will be max (Ntile_for_BW, Ntile_for_CuA).

The input/output (I/O) speed of the memory device defines the tR (the time needed to transfer, for example, a page to the controller). If the time needed by the partition to perform the access (Toperation) is greater than tR, then the controller needs to loop over Toperation/tR partitions (P0 to PN) to sustain the BW required by the host device.

In one example, adding the times required for phases of Tsel+Tstream+Tunsel gives a time for a random read operation (Toperation random (tRnd)). This is a time needed for internal operation.

A time required for each Tstream phase gives a time for a streaming read operation (Toperation during streaming).

A number of partitions to sustain a given bandwidth for streaming mode NpartStream=Tstream/tR. For example, a host is provided a codeword in tR time.

A number of partitions to sustain a given bandwidth for random mode NpartRnd=tRnd/tR. A bandwidth for streaming mode is determined as follows:

$$BWStream=NpartStream*NStreamUnit*PageSize/(Tsel+NStreamUnit*Tstream+Tunsel)$$

where NStreamUnit is equal to a number of stream units (e.g., SU0, SU1, . . . , SUn).

A bandwidth for random mode is determined as follows:

$$BWRnd=PageSize/tR$$

In one example, an input/output (1/O) speed of a memory device defines the tR. The I/O circuitry (pads) of the memory device can provide a certain bandwidth. In one example, an I/O speed (throughput on I/O pads) supports a DDR4 memory protocol. The number of I/O pads multiplied by the dimension of the codeword needed by the host device gives the time that needs to be typically sustained by the internal memory core of the memory device in order to supply the bandwidth required by the host device.

Figure 20:
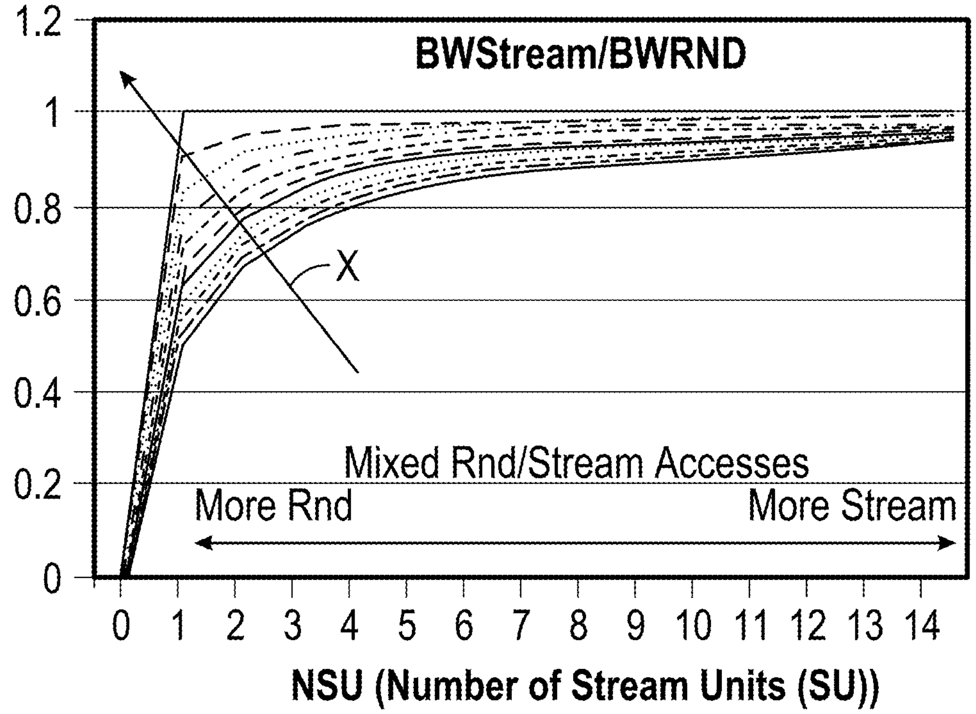
FIG. 20 shows exemplary relationships between data retrieval bandwidth for a streaming mode versus a random mode, in accordance with some embodiments.

FIG. 20 shows exemplary relationships between data retrieval bandwidth for a streaming mode versus a random mode, in accordance with some embodiments. As discussed above, a streaming mode read algorithm can provide speed performance improvement relative to a random read mode. This is in part because the Tsel and Tunsel phases can be a significant portion of the total random read timing budget. This portion can be defined as X=(Tsel+Tunsel)/Tstream. In one example, X is about 30%.

As a controller is able to use more streaming mode accesses, a memory device is more readily able to achieve a system bandwidth requirement. For example, if a streaming mode can be heavily used by a system, two options are possible: The bandwidth is improved while keeping the same number of partitions/chips; or the cost/power is improved while keeping the same bandwidth with less partitions active at the same time. This improvement generally applies to various types of memory access operations (e.g., read, write, etc.).

FIG. 20 illustrates a ratio (vertical axis) of streaming mode bandwidth to random mode bandwidth for a varying number of stream units used (horizontal axis).

As follows from the above discussion, $$BWStream/BWRnd=NStreamUnits/(x+NStreamUnits)$$

As more streaming mode accesses are used, the streaming mode bandwidth is improved relative to the random mode bandwidth. FIG. 20 also illustrates this relationship for varying values of X=(Tsel+Tunsel)/Tstream as indicated by the arrow denoted by "X".

Figure 21:
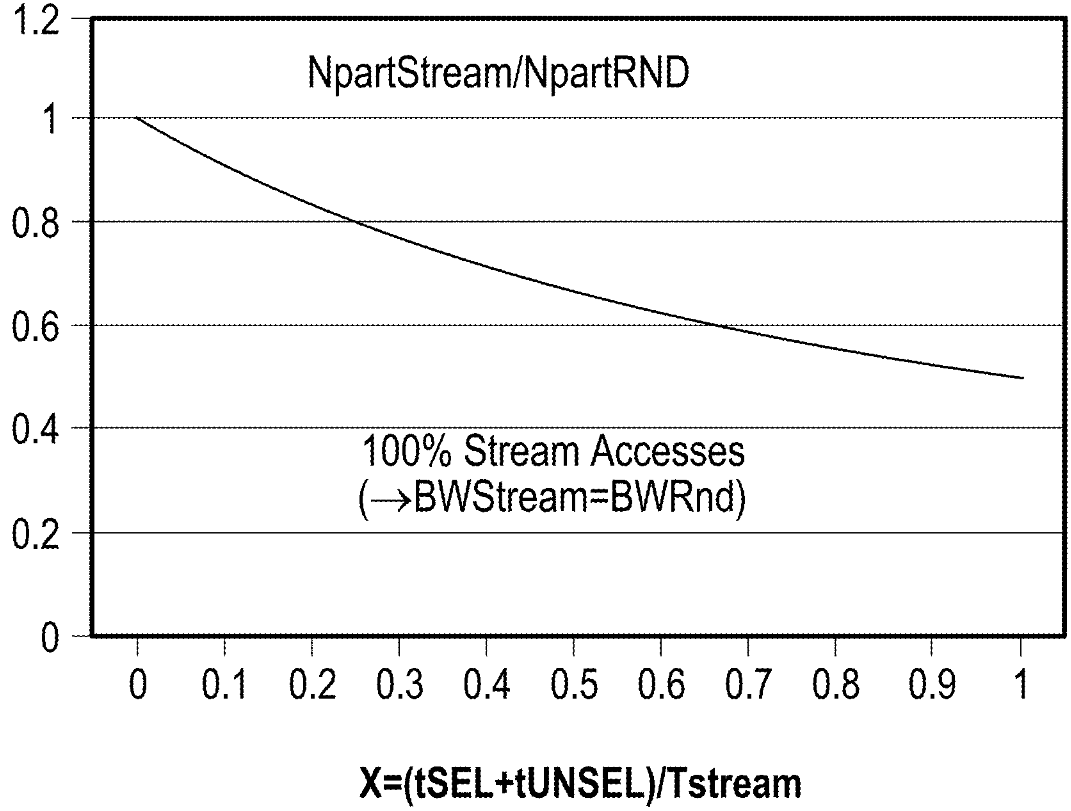
FIG. 21 shows an exemplary relationship between a number of partitions required to achieve a given bandwidth in a streaming mode versus a random mode, in accordance with some embodiments.

FIG. 21 shows an exemplary relationship between a number of partitions required to achieve a given bandwidth in a streaming mode versus a random mode, in accordance with some embodiments. For example, NpartStream=NpartRnd/(1+X) where X=(Tsel+Tunsel)/Tstream.

Figure 22:
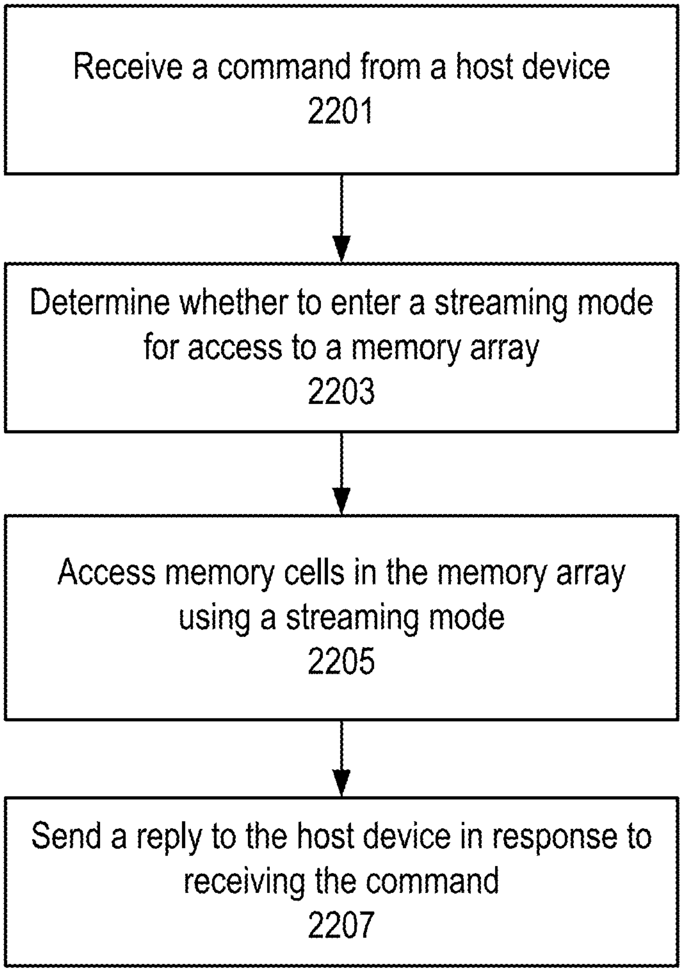
FIG. 22 shows a method using a streaming mode for accessing memory cells in a memory array, in accordance with some embodiments.

FIG. 22 shows a method using a streaming mode for accessing memory cells in a memory array, in accordance with some embodiments. For example, the method of FIG. 22 can be implemented in the system of FIGS. 1, 2.

The method of FIG. 22 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 22 is performed at least in part by one or more processing devices (e.g., controller 120 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 2201, a command is received from a host device. In one example, the command is a read or write command from host device 126.

At block 2203, a determination is made whether to enter a streaming mode for access to a memory array. In one example, controller 120 determines whether to access memory cells for performing a read operation based on comparing a read address provided from a host device 126 with address map 104.

At block 2205, memory cells in the memory array are accessed using a streaming mode. In one example, controller 120 accesses data cells 110 of memory array 102 using a streaming mode as illustrated in FIG. 18.

At block 2207, a reply is sent to the host device in response to receiving the command. In one example, the reply includes a codeword read from memory array 102. In one example, the reply includes an indication that requested data was written to memory 102.

In one embodiment, an apparatus comprises: a memory array (e.g., 102) comprising memory cells (e.g., 110); bias circuitry (e.g., 124) configured to apply voltages to the memory cells when performing read operations; sensing circuitry (e.g., 122) configured to read the memory cells; and a controller (e.g., 120) configured to: receive a command to read data at first and second addresses, wherein the first address corresponds to first memory cells of the memory array, the second address corresponds to second memory cells of the memory array, and the first and second memory cells are accessed using a common wordline; in response to receiving the command, bias, using the bias circuitry, a voltage of the wordline to an initial voltage (e.g., 1804); read, using the sensing circuitry, the first memory cells (e.g., read memory cells in phase Tstream1 of FIG. 18), including increasing a magnitude of the voltage (e.g., using a voltage ramp) of the wordline from the initial voltage; after reading the first memory cells, bias the wordline to return the voltage of the wordline to the initial voltage (e.g., 1806); and after returning the voltage of the wordline to the initial voltage, read, using the sensing circuitry, the second memory cells (e.g., read memory cells in phase Tstream2 of FIG. 18), including increasing a magnitude of the voltage of the wordline from the initial voltage.

In one embodiment, prior to reading the first memory cells, the voltage of the wordline is biased to the initial voltage from a voltage corresponding to an idle mode (e.g., idle voltage 1816); and after reading the second memory cells, the voltage of the wordline is biased to the voltage corresponding to the idle mode.

In one embodiment, the controller is further configured to: determine that the first and second memory cells are accessed using the same wordline (e.g., common wordline 160); wherein the wordline is biased to return the voltage of the wordline to the initial voltage in response to determining that the first and second memory cells are accessed using the same wordline.

In one embodiment, the determination is performed after reading the first memory cells.

In one embodiment, the controller is further configured to: determine, after reading each of the first and second memory cells, whether to return the voltage of the wordline to the initial voltage in preparation for performing a next read operation, or to a voltage corresponding to an idle mode in which the wordline is unselected.

In one embodiment, the next read operation is performed after reading the second memory cells, and the next read operation comprises reading third memory cells that are accessed using the wordline.

In one embodiment, the controller is further configured to: after reading the second memory cells, determine an address of data corresponding to a new read command received from a host device (e.g., 126); and based on the address of the data corresponding to the new read command, return the voltage of the wordline to the voltage corresponding to the idle mode.

In one embodiment, the controller is further configured to bias, using the bias circuitry, first digit lines (e.g., bias digit lines DL 1812 of FIG. 18) used to access the first memory cells.

In one embodiment, the first digit lines are biased in preparation for reading the first memory cells.

In one embodiment, the first digit lines are biased after the voltage of the wordline is at the initial voltage.

In one embodiment, the controller is further configured to bias, using the bias circuitry, second digit lines (e.g., bias digit lines 1820 of FIG. 18) used to access the second memory cells.

In one embodiment, after reading the first memory cells, the first digit lines are unselected, and the second digit lines are selected in preparation for reading the second memory cells.

In one embodiment, for reading each of the first and second memory cells, increasing the magnitude of the voltage of the wordline from the initial voltage comprises ramping the voltage of the wordline.

In one embodiment, the voltage of the wordline is ramped until a condition is satisfied.

In one embodiment, the condition is based on determining that at least one memory cell has switched. In one example, the switching memory cell is one of data cells 110. In one example, switching memory cell is one of pattern cells 112.

In one embodiment, the controller is further configured to: bias a gate line (e.g., bias gate line GL 1810 of FIG. 18) to electrically connect the bias circuitry to first digit lines used to access the first memory cells; and after biasing the gate line, bias the first digit lines to a voltage sufficient for reading the first memory cells.

In one embodiment, the controller is further configured to: bias at least one sensing node (e.g., sensing node SEN 1814 of FIG. 18) to a first voltage sufficient for sensing the first memory cells; wherein the sensing node is electrically coupled to the sensing circuitry and to the first memory cells, and wherein the sensing node discharges to a second voltage in response to at least one of the first memory cells switching.

In one embodiment, the controller is further configured to: after reading the first memory cells, bias the sensing node from the second voltage to the first voltage in preparation for reading the second memory cells.

In one embodiment, an apparatus comprises: a memory array comprising memory cells; bias circuitry configured to apply voltages when performing read and write operations; and a controller configured to: receive a command associated with first and second addresses, wherein the first address corresponds to first memory cells of the memory array, and the second address corresponds to second memory cells of the memory array; determine that the first and second memory cells are accessed using at least one common node; in response to receiving the command, bias, using the bias circuitry, at least one access line used to access the first memory cells to an initial state in preparation for reading or writing the first memory cells; after biasing the access line to the initial state, read or write the first memory cells; after reading or writing the first memory cells, bias, using the bias circuitry, the access line to the initial state in preparation for reading or writing the second memory cells; and read or write the second memory cells.

In one embodiment, the common node is at least one of a wordline (e.g., wordline 160), a gate line (e.g., gate line GL 1504), or a sensing node (e.g., sensing node 162).

In one embodiment, determining that the first and second memory cells are accessed using at least one common node comprises receiving an indication from a host device to perform read or write operations using sequential addressing, and in response to receiving the indication, entering a streaming mode for accessing the memory array.

In one embodiment, determining that the first and second memory cells are accessed using the common node is performed after reading or writing the first memory cells.

In one embodiment, the apparatus further comprises memory storing an address map (e.g., 104), wherein determining that the first and second memory cells are accessed using the common node comprises comparing at least one of the first or second addresses to the address map.

In one embodiment, the address map comprises physical addresses of the memory array and nodes associated with the physical addresses.

In one embodiment, a method comprises: receiving, from a host device, a read command; in response to receiving the read command, reading data in parallel from a plurality of partitions of a memory array, wherein: the data is read from each of the partitions using a streaming mode; and for each partition, the streaming mode comprises reading data from first and second memory cells of the respective partition using a common wordline; and sending the read data to the host device.

In one embodiment, a controller enters the streaming mode in response to determining that the first and second memory cells are accessed using the common wordline.

In one embodiment, for each partition: prior to reading the first memory cells, a voltage of the wordline is biased to an initial voltage from a voltage corresponding to an idle mode for the partition; the voltage of the wordline is biased to a maximum read voltage (e.g., a final maximum voltage of a ramp) when reading the first memory cells; and after reading the first memory cells, the voltage of the wordline is changed from the maximum read voltage to the initial voltage in preparation for reading the second memory cells (e.g., to apply a ramp to the second memory cells similarly as used for the first memory cells).

In one embodiment, a bias is maintained on the wordline during the streaming mode so that a voltage of the wordline does not fall below an initial voltage used when performing read operations.

In one embodiment, the first memory cells are accessed using digit lines (e.g., digit lines DL 1306) extending in a horizontal plane that is parallel to fingers (e.g., 1204, 1206) of the wordline; the first memory cells (e.g., 1208) are located on sides of vertical conductive pillars (e.g., 1210); and the digit lines are electrically connected to the first memory cells by the vertical conductive pillars.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures.

Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple Phone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:

sensing circuitry configured to read memory cells; and a controller configured to:

bias a voltage of a wordline to an initial voltage;

read, with the sensing circuitry, first memory cells;

after the first memory cells are read, bias the wordline to return the voltage of the wordline to the initial voltage; and read, with the sensing circuitry after the wordline is returned to the initial voltage, second memory cells, wherein the wordline is not discharged to zero volts between the first memory cells being read and the second memory cells being read.

2. The apparatus of claim 1, wherein:

prior to reading the first memory cells, the voltage of the wordline is biased to the initial voltage from a voltage corresponding to an idle mode; and after reading the second memory cells, the voltage of the wordline is biased to the voltage corresponding to the idle mode.

3. The apparatus of claim 1, wherein the controller is further configured to:

determine that the first and second memory cells are accessed using a same wordline;

wherein the wordline is biased to return the voltage of the wordline to the initial voltage in response to determining that the first and second memory cells are accessed using the same wordline.

4. The apparatus of claim 3, wherein the determination is performed after reading the first memory cells.

5. The apparatus of claim 1, wherein the controller is further configured to:

determine, after reading each of the first and second memory cells, whether to return the voltage of the wordline to the initial voltage in preparation for performing a next read operation, or to a voltage corresponding to an idle mode in which the wordline is unselected.

6. The apparatus of claim 5, wherein the next read operation is performed after reading the second memory cells, and the next read operation comprises reading third memory cells that are accessed using the wordline.

7. The apparatus of claim 5, wherein the controller is further configured to:

after reading the second memory cells, determine an address of data corresponding to a new read command received from a host device; and based on the address of the data corresponding to the new read command, return the voltage of the wordline to the voltage corresponding to the idle mode.

8. The apparatus of claim 1, wherein the controller is further configured to bias first digit lines used to access the first memory cells.

9. The apparatus of claim 8, wherein the first digit lines are biased in preparation for reading the first memory cells.

10. The apparatus of claim 9, wherein the controller is further configured to bias second digit lines used to access the second memory cells.

11. The apparatus of claim 10, wherein after reading the first memory cells, the first digit lines are unselected, and the second digit lines are selected in preparation for reading the second memory cells.

12. The apparatus of claim 8, wherein the first digit lines are biased after the voltage of the wordline is at the initial voltage.

13. The apparatus of claim 1, wherein reading each of the first and second memory cells includes ramping the voltage of the wordline.

14. The apparatus of claim 13, wherein the voltage of the wordline is ramped until a condition is satisfied.

15. The apparatus of claim 14, wherein the condition is based on determining that at least one memory cell has switched.

16. The apparatus of claim 1, wherein the controller is further configured to:

bias a gate line to electrically connect bias circuitry to first digit lines used to access the first memory cells; and after biasing the gate line, bias the first digit lines to a voltage sufficient for reading the first memory cells.

17. The apparatus of claim 1, wherein the controller is further configured to:

bias at least one sensing node to a first voltage sufficient for sensing the first memory cells;

wherein the sensing node is electrically coupled to the sensing circuitry and to the first memory cells, and wherein the sensing node discharges to a second voltage in response to at least one of the first memory cells switching.

18. The apparatus of claim 1, wherein the controller is further configured to:

after reading the first memory cells, bias a sensing node in preparation for reading the second memory cells.

19. The apparatus of claim 1, wherein the wordline used to read the first memory cells and the wordline used to read the second memory cells is a single, common wordline.

20. The apparatus of claim 1, wherein the wordline is not discharged to an idle mode voltage between the first memory cells being read and the second memory cells being read.

21. The apparatus of claim 1, wherein the initial voltage is a non-zero voltage level.

22. The apparatus of claim 1, wherein the first memory cells are read at a different voltage from the initial voltage.

23. The apparatus of claim 1, wherein the second memory cells are read at a different voltage from the initial voltage.

24. The apparatus of claim 1, wherein the first memory cells are read at a first voltage different from the initial voltage, the second memory cells are read at a second voltage different from the initial voltage, and the first voltage is different from the second voltage.

25. An apparatus comprising:

sensing circuitry configured to read first and second memory cells sequentially;

and a controller configured to:

read, with the sensing circuitry, the first memory cells, including increasing a magnitude of a voltage of a wordline from an initial voltage; and read, with the sensing circuitry, the second memory cells, including increasing a magnitude of the voltage of the wordline from the initial voltage, wherein the wordline is returned to the initial voltage between the first memory cells being read and the second memory cells being read, and wherein the wordline is not discharged to zero volts between the first memory cells being read and the second memory cells being read.

26. The apparatus of claim 25, wherein the controller is further configured to:

receive a command to read data stored in the first and second memory cells, wherein the first and second memory cells are accessed using the wordline; and in response to receiving the command, bias a voltage of the wordline to the initial voltage.

27. A method comprising:

reading, by a controller using a sensing circuitry of a memory device, first memory cells of the memory device, wherein the reading of the first memory cells includes increasing a magnitude of a voltage of a wordline from an initial voltage; and reading, by the controller using the sensing circuitry, second memory cells of the memory device, wherein the reading of the second memory cells includes increasing a magnitude of the voltage of the wordline from the initial voltage, wherein the wordline is returned to the initial voltage between the first memory cells being read and the second memory cells being read.

28. The method of claim 27, wherein the wordline is not discharged to zero volts between the first memory cells being read and the second memory cells being read.

29. The method of claim 27, wherein the first memory cells are read at a first voltage different from the initial voltage, the second memory cells are read at a second voltage different from the initial voltage, and the first voltage is different from the second voltage.

30. An apparatus comprising:

sensing circuitry configured to read memory cells; and a controller configured to:

bias a voltage of a wordline to an initial voltage;

read, with the sensing circuitry, first memory cells, wherein the first memory cells are read at a first voltage different from the initial voltage;

after the first memory cells are read, bias the wordline to return the voltage of the wordline to the initial voltage; and read, with the sensing circuitry after the wordline is returned to the initial voltage, second memory cells, wherein the second memory cells are read at a second voltage different from the initial voltage, and wherein the first voltage is different from the second voltage.

* * * * *